United States Patent [19]
Doty

[11] Patent Number: 5,530,355
[45] Date of Patent: Jun. 25, 1996

[54] SOLENOIDAL, OCTOPOLAR, TRANSVERSE GRADIENT COILS

[75] Inventor: F. David Doty, Columbia, S.C.

[73] Assignee: Doty Scientific, Inc., Columbia, S.C.

[21] Appl. No.: 362,598

[22] PCT Filed: May 13, 1993

[86] PCT No.: PCT/US93/04574

§ 371 Date: Jan. 10, 1995

§ 102(e) Date: Jan. 10, 1995

[87] PCT Pub. No.: WO94/01785

PCT Pub. Date: Jan. 20, 1994

[51] Int. Cl.$^6$ .............................. G01V 3/14; H01F 5/02; H01F 27/28
[52] U.S. Cl. .......................... 324/318; 324/322; 335/299; 336/225
[58] Field of Search ................................. 324/318, 322, 324/300; 335/299; 336/225

[56] References Cited

U.S. PATENT DOCUMENTS

| | | |
|---|---|---|
| 2,354,331 | 7/1944 | Polydoroff . |
| 2,498,475 | 2/1950 | Adams . |
| 3,237,090 | 2/1966 | Royer et al. . |
| 3,466,499 | 9/1969 | Beth . |
| 3,569,823 | 3/1971 | Golay . |
| 3,671,902 | 6/1972 | Westendorp . |
| 3,789,832 | 2/1974 | Damadian . |
| 3,924,211 | 12/1975 | Ioffe et al. . |
| 3,932,805 | 1/1976 | Abe et al. . |
| 4,038,622 | 7/1977 | Purcell ................................. 335/216 |
| 4,165,479 | 8/1979 | Mansfield . |
| 4,468,622 | 8/1984 | Frese et al. . |
| 4,514,586 | 4/1985 | Waggoner . |
| 4,595,899 | 6/1986 | Smith et al. . |
| 4,642,569 | 2/1987 | Hayes et al. . |
| 4,646,024 | 2/1987 | Schenck et al. . |
| 4,646,046 | 2/1987 | Vavrek et al. . |
| 4,707,663 | 11/1987 | Minkoff et al. ........................ 324/319 |
| 4,733,189 | 3/1988 | Punchard et al. . |
| 4,737,716 | 4/1988 | Roemer et al. . |

(List continued on next page.)

FOREIGN PATENT DOCUMENTS

| | | |
|---|---|---|
| 304126 | 2/1989 | European Pat. Off. . |
| 586983 | 3/1994 | European Pat. Off. . |
| 4029477 | 4/1991 | Germany . |
| 54-38792 | 3/1979 | Japan . |
| 2050062 | 12/1980 | United Kingdom . |

OTHER PUBLICATIONS

E. C. Wong et al., Magnetic Resonance in Medicine, vol. 21, 1 Sep. 1991, pp. 39–48.

J. P. Boehmer et al., Journal of Magnetic Resonance, vol. 83, 1 Jun. 1989, pp. 152–159.

Y. Bangert and P. Mansfield, J. Physics E 15, "Magnetic Field Gradient Coils for NMR Imaging," 235–239 (1982).

P. Mansfield and B. Chapman, J. Magnetic Resonance 66, "Active Magnetic Screening of Gradient Coils in NMR Imaging," 573–576 (Feb. 1986).

(List continued on next page.)

*Primary Examiner*—Sandra L. O'Shea
*Assistant Examiner*—Roger Phillips
*Attorney, Agent, or Firm*—Oppedahl & Larson

[57] ABSTRACT

A structure provides a gradient field useful in magnetic resonance imaging. Axially aligned, solenoidal-like coils are symmetrically distributed around the perimeter of the bore of a superconducting magnet in an MRI system so as to produce transverse gradients in the X and Y directions with exceptionally high efficiency and exceptionally low acoustic noise. Opposed solenoidal endcoils may be added to reduce axial flux leakage by generating an axial quadrupolar field. Radially aligned coils may be positioned near each end of the axial coils to reduce leakage flux by adding a transverse quadrupolar field to form a resulting octopolar field. Typically, the solenoid-like coils have a mean radius of about 15% of the radius of that of the imaging ellipsoidal region. A thick-walled stainless steel, copper and resin cylinder may be used to simplify gradient shielding problems. Silver plated bronze or stainless steel sheet is used as an rf shield.

43 Claims, 9 Drawing Sheets

U.S. PATENT DOCUMENTS

| | | |
|---|---|---|
| 4,766,383 | 8/1988 | Fox et al. . |
| 4,768,008 | 8/1988 | Purcell et al. . |
| 4,820,988 | 4/1989 | Crooks et al. . |
| 4,849,696 | 7/1989 | Brun et al. . |
| 4,849,697 | 7/1989 | Cline et al. ............................ 324/306 |
| 4,876,479 | 10/1989 | Kawabata et al. . |
| 4,876,510 | 10/1989 | Siebold et al. . |
| 4,885,540 | 12/1989 | Snoddy et al. ......................... 324/318 |
| 4,896,129 | 1/1990 | Turner et al. . |
| 4,910,462 | 3/1990 | Roemer et al. . |
| 4,920,011 | 4/1990 | Ogawa et al. . |
| 4,926,125 | 5/1990 | Roemer . |
| 4,935,714 | 6/1990 | Vermilyea . |
| 4,954,781 | 9/1990 | Hirata . |
| 4,965,521 | 10/1990 | Egloff . |
| 4,978,920 | 12/1990 | Mansfield et al. . |
| 5,036,282 | 7/1991 | Morich et al. . |
| 5,055,789 | 10/1991 | Kondo et al. . |
| 5,061,891 | 10/1991 | Totsuka et al. . |
| 5,072,184 | 12/1991 | Dickinson . |
| 5,084,676 | 1/1992 | Saho et al. . |
| 5,132,621 | 7/1992 | Kang et al. . |
| 5,166,619 | 11/1992 | Ries . |
| 5,185,577 | 2/1993 | Minemura . |
| 5,198,769 | 3/1993 | Frese et al. . |
| 5,225,782 | 7/1993 | Laskaris et al. . |
| 5,235,283 | 8/1993 | Lehne et al. . |

OTHER PUBLICATIONS

P. Mansfield and B. Chapman, J. Magnetic Resonance 72, "Multinshield Active Magnetic Screening of Coil Structures in NMR," 211–233 (1987).

D. G. Taylor, R. Inamdar and M–C Bushell, Phys. Med. Biol. 33, "NMR Imaging in Theory and in Practice," 635–670 (1988).

B. H. Suits and D. E. Wilken, J. Physics E 22, "Improving Magnetic Field Gradient Coils for NMR Imaging," 565–573 (1989).

R. Hurwitz et al., Radiology 173, "Acoustic Analysis of Gradient–Coil Noise in MRI," 545–548 (1989).

J. J. Van Vaals and A. H. Bergman, J. Magnetic Resonance 90, "Optimization of Eddy–Current Compensation," 52–70 (1990).

M. K. Stehling, R. Turner, P. Mansfield, Science 254, "Echo–Planar Imaging: Magnetic Resonance Imaging in a Fraction of a Second," 43–49 (1991).

A. Jasinski et al., Magnetic Resonance in Medicine 24, "Shielded Gradient Coils and Radio Frequency Probes for High–Resolution Imaging of Rat Brains," 29–41 (1992).

P. Jehenson, M. Westphal, and N. Schuff, J. Magnetic Resonance 90, "Analytical Method for the Compensation of Eddy–Current Effects Induced by Pulsed Magnetic Field Gradients In NMR Systems" (1990) 264–278.

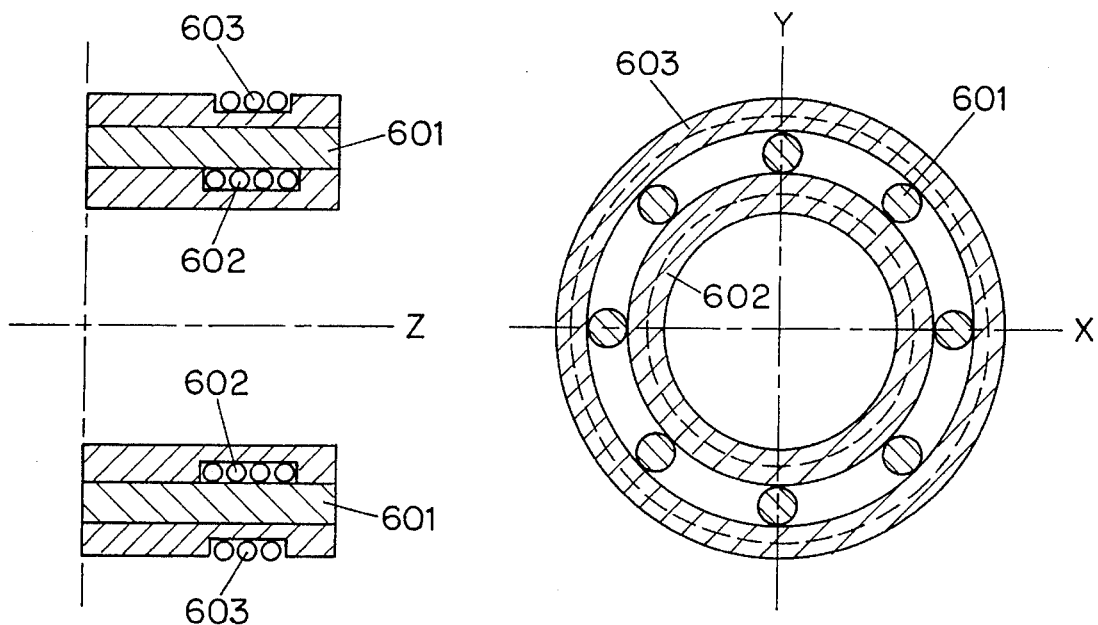
FIG. 6a
FIG. 6b
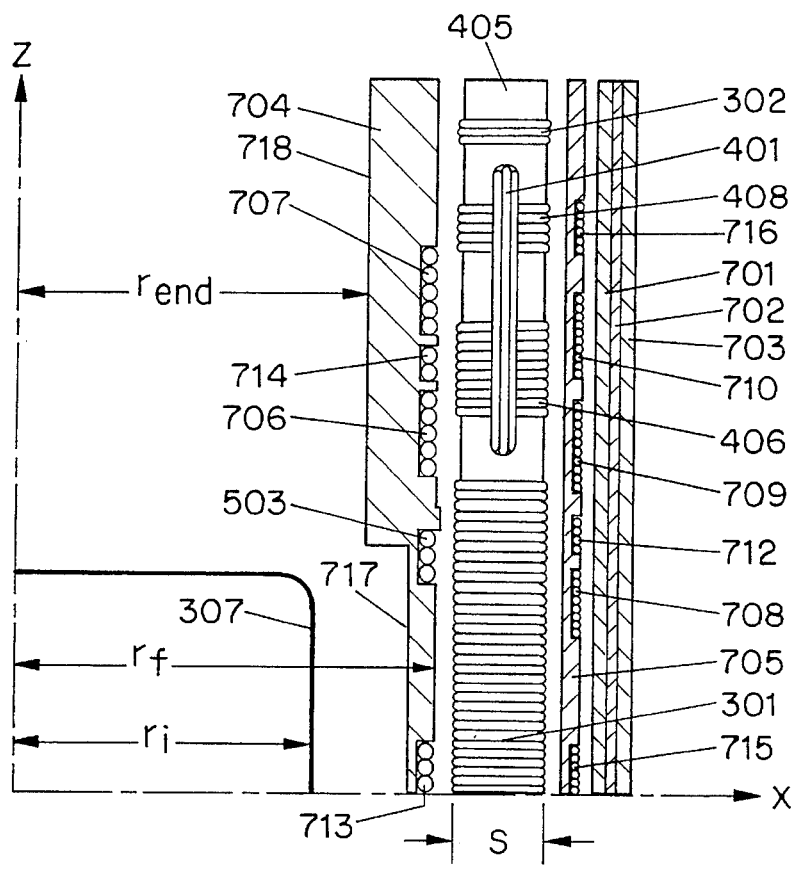
FIG. 7

SOLENOIDAL, OCTOPOLAR, TRANSVERSE GRADIENT COILS

FIELD OF THE INVENTION

The field of this invention is electromagnetic coils for the purpose of efficiently generating transverse gradients, especially in magnetic resonance imaging (MRI) and other gradient techniques employing a superconducting magnet.

BACKGROUND OF THE INVENTION

A large number of gradient-based MRI techniques have been developed since its independent invention by Paul Lauterbur and Peter Mansfield in 1973, following the invention of the static technique of Damadian in 1972. Most modern MRI systems utilize a superconducting solenoid to establish a uniform $B_0$ (or $B_z$) over the imaging volume. This results in the magnetic field being colinear with the path available for sample access. Coils are then required to produce monotonic (preferably linear) gradients in $B_z$ with respect to x, y, and z over the sample region during precisely determined pulse sequences. The transverse gradients ($\delta B_z/\delta x$, $\delta B_z/\delta y$) in the prior art have generally been established by symmetrically located sets of saddle coils, similar to those first described by Golay in U.S. Pat. No. 3,569,823 or by related planar coils as disclosed by Roemer, U.S. Pat. No. 4,926,125 and Morich et al., U.S. Pat. No. 5,036,282. Maxwell pairs are universally used to generate the axial gradient, notwithstanding the incorrect usage of the word "toroidal" by Frese and Siebold in U.S. Pat. No. 4,468,622. The instant invention achieves order-of-magnitude improvements in several critical parameters for transverse gradient coils: acoustic noise, DC gradient efficiency, and high-speed switching efficiency.

The closest prior art to the instant invention, in terms of magnetic field configuration, appears to be the trapezium loops for use with an electromagnet, as disclosed in the article "Magnetic Field Gradient Coils for NMR Imaging" by Bangert and Mansfield in *Journal Physics, E*, 15, 235 (1982). The semi-cylindrical concept depicted by Mansfield in U.S. Pat. No. 4,165,479, while having some similar features, is not closely related, as its major field component is orthogonal to $B_z$.

The gradient pulses induce eddy currents and vibrations in nearby conducting structures (especially in flimsy shields, in the cryostat, and in light-weight rf coils) which perturb the field homogeneity following the pulses with time and spatial dependencies that are not easily characterized. Active shielding coils, were first publicly disclosed by Mansfield in 2/1986 at approximately the same time that Roemer filed the patent application which resulted in U.S. Pat. No. 4,737,716. Prior independent work was underway at Doty Scientific, who shipped the first such commercially available coils in 1/1987. FIG. 1 approximately depicts typical shielded Golay coils to generate $\delta B_z/\delta x$ in the sample in the vicinity of the origin. A similar set of concentric coils, rotated 90°, is used to generate $\delta B_z/\delta y$. FIG. 2 shows second-order shielding of the Maxwell pair, or anti-Helmholtz coils, as used to generate linear $\delta B_z/\delta z$ near the origin. Gradient coils 201, 202 at mean location $z \approx \pm r_f$ have about 2.5 times the amp-turns of shield coils 203, 204 when $s \approx 0.3$ $r_f$. Axial shield coils 205, 206 have about one-tenth the amp-turns of the gradient coils. Gradient linearity of ±20% is achieved over a sphere of radius 0.7 $r_f$, and leakage flux through a cylinder of radius 1.4 $r_f$ is reduced by a order of magnitude compared to the unshielded case. Higher-order shielding achieves another order-of-magnitude reduction in leakage, but shielding techniques have never fully measured up to original expectations because of motion-related artifacts, especially ghosting in the phase-encoding direction and battle-zone levels of acoustic noise.

Recovery time is often found to increase quadratically with pulse amplitude, indicating it is related more to motion than to eddy currents. It is in fact arguable that eddy currents per se are no longer a significant problem with typical shielded coils and optimized multi-exponential high-pass compensation that includes first-order cross terms as described by Van Vaals and Bergman, but rather the vibrations produced by the eddy currents in passive shields are the cause of residual image artifacts, as the time constants of the high-order eddy currents in passive shields are generally much less than the mechanical vibration time constants. Kondo et al. in U.S. Pat. No. 5,055,789 disclose a partial solution to the image artifact problem.

The gradient coil design problem is fundamentally limited by the conflicting requirements of fast response and reasonable field linearity (spatially constant gradients) over the sample volume. The major technical problems center around the following: (1) limited available space because of economic considerations, (2) motion-induced artifacts arising from the finite stiffness and mass of the coil support structure, (3) practicable coil winding (or etching) techniques, (4) acoustic noise abatement, and (5) heat dissipation.

The conflicting technical requirements may be partially addressed by means of local planar gradient coils with highly non-linear response, as disclosed by Roemer, U.S. Pat. No. 4,926,125. By adding distortion correction algorithms to the image processing, it is possible to utilize gradients with ±40% to ±60% non-linearity on one axis in applications where high spatial resolution is required only over a small portion of the image.

The following parameters generally need to be specified for gradient coil systems: gradient coefficient α (T/Am) (sometimes called gradient efficiency in the prior art), imaging ellipsoid radius $r_i$ (m) and axial length $h_i$ for a specified linearity, inductance L (H), resistance $R_E$ (Ω), maximum continuous power dissipation P (W), maximum pulse current $I_P$ (A) in a specified $B_0$, recovery time $T_D$ (s) for a specified pulse, and acoustic noise for a specified pulse sequence in a specified field.

For the fastest imaging techniques, Echo Planar Imaging (EPI) and related techniques, the most important parameters are acoustic noise, recovery time, and gradient power. EPI can produce complete 2-dimensional images in 30 ms and repeat the process several times per second, compared to minimum imaging times of several minutes for conventional spin-echo techniques. In addition to the enormous prospects for increased patient throughput in MRI, EPI allows realtime monitoring of heart valve function and even realtime analysis of brain response to visual and auditory stimuli.

Although EPI was first described 15 years ago, it has seldom been used because prior art gradient coils (a) may require megawatts of gradient driver power on the frequency-encoding axis, (b) generate sound pressure levels that are painful and damaging to the patient's hearing, (c) produce motion-related artifacts that cannot be fully removed even with the most sophisticated image post-processing, and (d) require high power audio amplifiers costing up to several million dollars. A recent experimental demonstration at 0.5 T required nearly half a megawatt (at 10% duty cycle) at one kHz, and others have proposed the use of 2 MW at 5 kHz, 1.5 T, and 50% duty cycle for slice-interleaved techniques. The above problems may be partially addressed using a tuned transverse gradient with sinusoidal (monochromatic) current; but the conventional gradient coil has very low electrical Q; and there are penalties in SNR (signal to noise ratio) and heat dissipation. Also, computational analysis becomes more complex, but that objection is trivial.

While the Maxwell z-gradient is considerably more efficient than the Golay transverse gradient, the frequency-encoding gradient must be in the plane of the image, which often must be transverse for medical reasons. Hence, order-of-magnitude improvements are needed in transverse gradients.

The image artifact problem can begin to be appreciated by noting that while the frequency-encoding gradient may be driven with a 500 kW trapezoidal wave form, the phase-encoding gradient is being driven with short "blips" of several kilowatts at very low duty cycle, and the slice-selection axis is nulled. It is quite easy for non-linear, vibration-dependent couplings between the frequency-encoding axis and the other axes to destroy the required degree of orthogonality between the axes and produce phase-related artifacts. Moreover, cylindrical asymmetries in rf and gradient shields can make the orthogonality frequency and amplitude dependent.

The availability of better image processing and distortion correction techniques suggests that the linearity standard be increased to ±20%, compared to the more typical ±10% value for prior art whole-body systems. (Linearity in prior art MR microscopy is typically ±4% or better because the rf coils require a relatively large exterior dead space, which necessarily makes gradient linearity very good over the small sample region.) Increasing the non-linearity allowance from ±10% to ±20% increases the imaging volume by typically 50%. It is still important that the field be monotonic, but the method of Schenck et al. in U.S. Pat. No. 4,646,024 results in relatively poor switching efficiency, intolerable acoustic noise, and unmanageable motion-related artifacts.

Designing for large gradient non-linearity with very fast switching capability places increased (though inconsequential) computational demands on the image processing and may result in some increased variation in SNR over the final image. However, the enormous bandwidth (several MHz) of high-resolution EPI (and other more advanced techniques) can reduce the imaging time by two or three orders of magnitude without placing unrealistic demands on modern computers since computational power per cost has increased at the rate of 40% per year for the past seven years and that rate is expected to continue for several more years.

Magnetic energy storage estimates can be enlightening. Assume gradients of 1 T/m over an imaging sphere of 14-mm radius (±20% linearity) for a typical solids microscopy application using a transverse gradient coil of 45-mm diameter. We might then expect maximum gradient fields of about 0.02 T (50% more than the sample's maximum) over a volume of perhaps 60 ml (6 times the sample volume); hence, 0.01 J. Switching this field in 100 μs would require 100 W, assuming relatively low resistive loss, which can easily be achieved. In practice, using conventional shielded gradient coils, the inductive energy ($I^2L/2$) is larger than suggested by simple energy estimates as above by a factor of twenty to one hundred.

While most of the wasted magnetic energy in Golay coils is external to the patient in MRI, the unusable magnetic energy (the integral of the rms value of $B_x+B_y$) over the patient may be an order of magnitude larger than the usable field (the integral of the rms value of $\delta B_z/\delta x$ or $\delta B_z/\delta y$ over the image volume). It is the switching of this enormous non-gradient field from the Golay geometry that causes the sensory stimuli in patients during EPI experiments and limits clinical applications. It is also this non-gradient field that is responsible for virtually all of the eddy currents and vibrations induced in the rf coils, as the desired gradient field is axial and its dipole moment is zero.

Conventional transverse gradient coils have always been designed from the deeply ingrained perspective that a single large coil is more efficient and less costly than a collection of smaller coils. This notion may be true most of the time, but not when it comes to complex field geometries. Maxwell's laws make it impossible to design coil systems that generate single field gradients (they must come at least in pairs) but it is not necessary to have large orthogonal field components.

Some prior gradient coil designs have also suffered under the false notion that there is an inherent advantage with very low inductance coils. Higher inductance (more turns) requires higher voltage, but not higher power (VA) for the same switching time. In fact, reducing inductance below 100 μH is detrimental as lead inductance and transmission line problems then become significant. Coil orthogonality (for isolation) and net force cancellation both dictate that integral numbers of turns be used in all coil sets and coil subsets. Hence, the accuracy of the shielding is limited from this quantization. The more turns, the more precisely the gradients can be shielded. Optimum number of turns is thus determined largely by the VA characteristics and economics of available power devices, magnetic shielding accuracy requirements, and standard wire insulation practice, making 250 V to 800 V (peak differential voltage for a balanced line) at 10 A to 100 A best for large systems. Optimum inductance is typically 0.2 to 1 mH.

SUMMARY OF THE INVENTION

Axially aligned, solenoidal-like coils are symmetrically distributed around the perimeter of the bore of a superconducting magnet in an MRI system so as to produce transverse gradients in the x and y directions with exceptionally high efficiency and exceptionally low acoustic noise. Opposed solenoidal end-coils may be added to reduce axial flux leakage by generating an axial quadrupolar field. Radially aligned coils may be positioned near each end of the axial coils to reduce leakage flux by adding a transverse quadrupolar field to form a resulting octopolar field. Alternatively, Golay-type coils may be used for the transverse quadrupolar field with some improvement in efficiency. Typically, the solenoidal-like coils have a mean radius of about 15% of the radius of that of the imaging ellipsoidal region. The cylindrical rf shield between the imaging ellipsoid and the gradient coils may have smaller radius at the ends than near the center. Radial forces in axial gradient systems are largely canceled by concentric support members between the gradient and shield coils. A thick-walled stainless steel, copper, and resin cylinder may be used to simplify gradient shielding problems. Silver plated bronze or stainless steel sheet is used as an rf shield.

BRIEF DESCRIPTION OF THE DRAWINGS

The invention will be described with respect to a drawing, of which

FIG. 6 discloses a shielded axial gradient coil system with concentric support members.

FIG. 7 is a longitudinal cross section of a complete x-y-z gradient coil system with central inside radius larger than end inside radius.

Throughout the figures, like elements have been shown where possible with like reference numerals.

DETAILED DESCRIPTION OF THE PREFERRED EMBODIMENT

Figure 1:
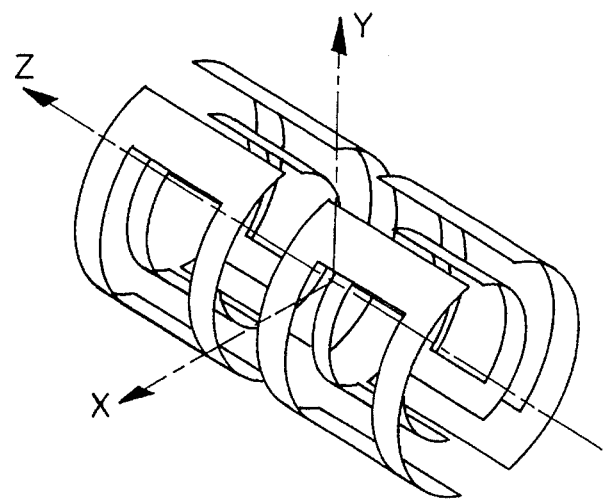
FIG. 1 illustrates the prior-art, shielded, Golay-type, transverse gradient coils.
Figure 2:
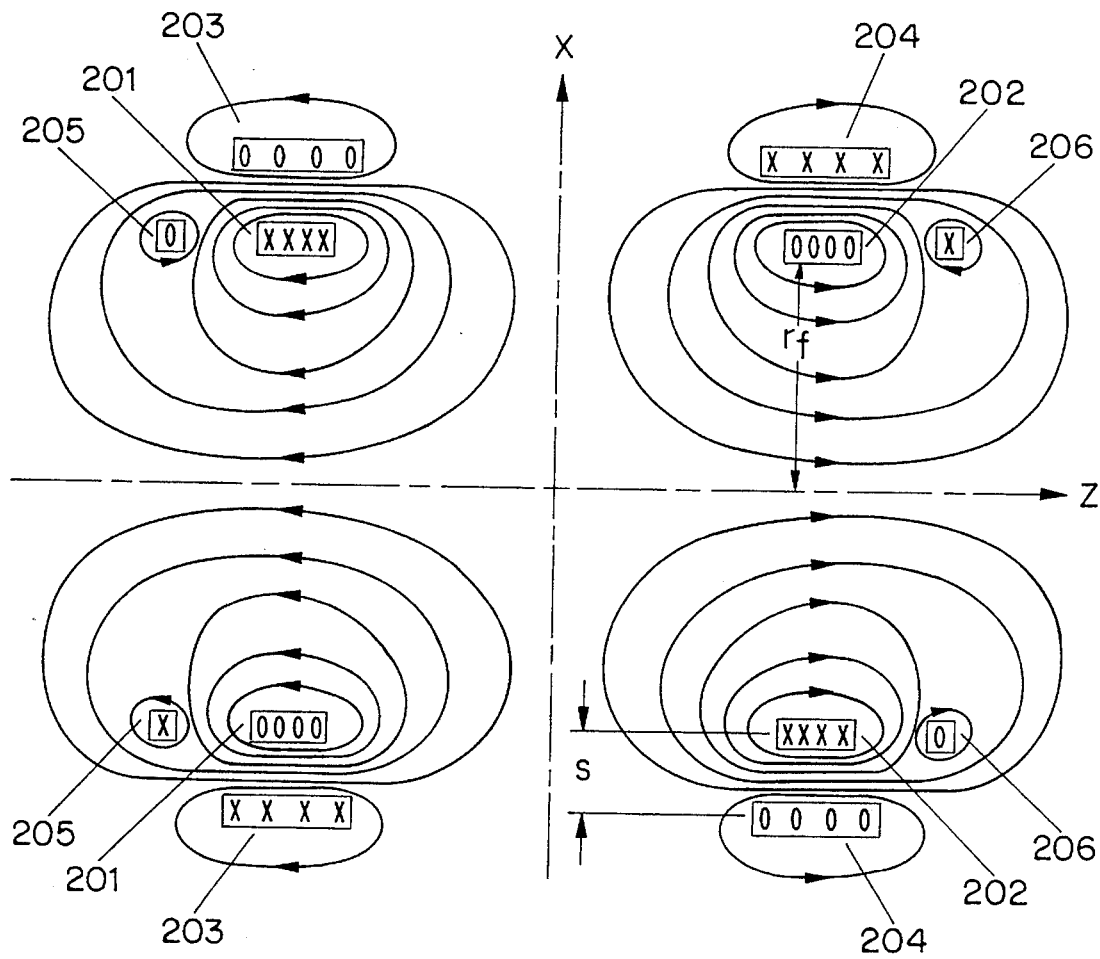
FIG. 2 is a longitudinal cross section of the prior-art, shielded, Maxwell-pair axial gradient coils.

Qualitative comparisons of various gradient coil geometries of different sizes are often misleading because of the complex expressions for power, inductance, resistance, and gradient coefficient and the varying degrees of sensitivity to coil motion. For example, power is often proportional to radius to the fifth power for constant winding thickness and voxel size. But power may be linear with radius for constant number of voxels and constant relative winding thickness, depending on the relative significance of $\gamma G r_i T_2$ and SNR in determining spatial resolution, where $\gamma$ is the magnetogyric ratio, G is the magnetic field gradient (T/m), and $T_2$ is the spin-spin relaxation time (s). Thus, it is useful to develop dimensionless figures of merit for comparison of various gradient coil systems of various sizes.

We begin a dimensionless analysis by defining a switching figure-of-merit, or switching efficiency, $$\eta_S = \frac{U_S}{U_T}, \tag{1}$$

where $U_S$ is the gradient energy over the maximum sample volume of $\pm 20\%$ field linearity and $U_T$ is the total gradient energy over all space.

$$U_s \approx g \, (\alpha I r_i)^2 \frac{V}{2\mu_0}, \tag{2}$$

where g is a dimensionless integration factor as implicitly defined in the above equation and is approximately equal to 0.2 for typical ellipsoidal sample geometry (g=0.33 for a cube), V is the maximum imaging volume (m³), $\mu_0$ is the permeability of free space, and $\alpha$ is the mean gradient coefficient (T/Am).

$$U_T = I^2 \frac{L}{2}, \tag{3}$$

hence, for convenience, we re-define the switching efficiency as $$\eta_S = \frac{\alpha^2 r_i^4 h_i}{2\mu_0 L}, \tag{4}$$

where $h_i$ is the axial imaging length. The above efficiency has typical numeric value between 0.001 and 0.008 for shielded Golay coils, or 0.005 to 0.03 for Maxwell pairs and quadrupolar coils for use in magnets with transverse $B_0$. This suggests at least an order-of-magnitude improvement in switching efficiency should be possible for transverse gradients with novel coil geometries.

Next we define a low frequency (LF) efficiency $\eta_L$ by comparing the quality of the gradient coil system to that of a simple solenoid.

$$\eta_L = \frac{P_0}{P_G}, \tag{5}$$

where $P_0$ is the power required to generate a peak magnetic field of $B_G$ in a copper solenoid of radius $r_i$ and length $2r_i$ at angular frequency $\omega_m$ at room temperature, and $P_G$ is the power required to generate a peak gradient of $B_G$ at radius $r_i$ using the gradient coils for the same conditions.

It is easily shown from basic principles and definitions (and is experimentally confirmed) that $$P_0 \approx \frac{B_G^2 \omega_1 V}{\mu_0 Q_0}, \tag{6}$$

where $Q_0$ is the ratio of the reactance to the series resistance at frequency $\omega_1$. The LF Q at room temperature of a copper solenoid (with full surface coverage) with length equal to its diameter is easily estimated as $$Q \approx 5 r_i \sqrt{\omega_1} \quad \left[\frac{s^{0.5}}{m}\right], \tag{7}$$

where we assume the copper thickness to be greater than twice the skin depth $\delta$ at the test frequency. (This condition is not met in small coils at low frequencies, as $\delta$=6.5 mm at 100 Hz.) Hence, $$P_0 \approx B_G^2 \sqrt{\omega_1} \frac{r_i^2}{\mu_0} \quad \left[\frac{m}{s^{0.5}}\right], \tag{8}$$

$$P_G = I^2 R_E = B_G^2 \frac{R_E}{\alpha r_i^2} \quad \left[\frac{m}{s^{0.5}}\right], \tag{9}$$

where the constants in the above equations have units as indicated in brackets so as to maintain SI consistency and arise from the skin depth of copper at room temperature as a function of frequency. We now re-define $\eta_L$ as the ratio of the above expressions for $P_0$ and $P_G$:

$$\eta_L = \frac{\sqrt{\omega_1} \, \alpha^2 r_i^4}{\mu_0 R_E} \quad \left[\frac{m}{s^{0.5}}\right]. \tag{10}$$

At 100 Hz, this evaluated to 0.0004 for a typical prior-art transverse coil designed for $r_i$=42 mm (the copper thickness was about half of the skin depth) but values below 0.0001 are typical for large planar transverse gradient coils. Typical values for Maxwell-pairs are near 0.002, and there is usually little justification for higher LF efficiency. It would appear that there is room for at least an order-of-magnitude improvement in LF efficiency of transverse gradient coils. A more accurate figure of merit governing efficiency during EPI is the product of $\eta_S$ and the electrical Q at the switching frequency (e.g., 1600 Hz), but that cannot be determined without knowledge of the winding thicknesses and surface areas, which are rarely given in the published literature.

Coil motion is generally the most troublesome design limitation—perhaps because it is more difficult to construct a generalized figure of merit that satisfactorily accounts for vibration of the gradient coils and of the nearby structure.

The governing equations change radically depending on whether most of the energy in the gradient pulse spectrum is below or above the fundamental mechanical mode to which it is strongly coupled.

The saddle coils in conventional Golay-type transverse gradient coils in a uniform external magnetic field develop opposite torques which cause the cylindrical coilform to bow in the plane of the z-axis and the desired gradient.

For very small coil systems, the LF limit is usually applicable—$\omega_g \ll \omega_b$, where $\omega_g$ corresponds to the dominant component in the gradient power spectrum and $\omega_b$ is the fundamental (symmetric bowing) vibration mode. For a cylindrical coilform supporting conventional transverse gradient coils, the form experiences balanced bowing torques equivalent to a transverse force $F_B$ at the center (and $-F_B/2$ at each end) approximately equal to $n_t I B_0 r_f$, where $n_t$ is the total number of turns (4 quadrants) and $r_f$ is the mean radius of the coilform. The bowing stiffness $k_b$ (N/m) for elastic (Youngs) modulus Y, wall thickness w (where $w \ll r_f$), and axial coilform length h is given approximately by $$k_b \approx 100 \frac{Y r_f^3 w}{h^3} . \qquad (11)$$

The bowing mode $\omega_b$ of a medium-walled cylindrical coilform, heavily loaded at both ends (the typical case), is approximately as follows:

$$\omega_b \approx 5 \frac{r_f c}{h^2} , \qquad (12)$$

$$c = \sqrt{\frac{Y}{\rho}} , \qquad (13)$$

where $\rho$ is the mean wall density and c is the acoustic velocity. (For very thin walls, surface modes occur at lower frequencies. For very thick walls, the coefficient in equation [12] drops to about 3.)

For an axially aligned solenoidal coil in a uniform external field, the Lorentz forces are radial. The radial stiffness of a thin-walled cylinder is $$k_r = \frac{2\pi h Y w}{r_f} . \qquad (14)$$

Thus, the fundamental radial mode $\omega$, of a thin-walled cylinder is $$\omega_r \approx \frac{c}{r_f} . \qquad (15)$$

The mechanical energy $U_M$ in the LF regime is approximately $F^2/2k$. It is independent of the pulse length, and seldom significant, as k can be made quite large.

For the typical case of high-power copper coils epoxied into grooves cut into fiberglass forms, it is difficult to estimate effective k and m (or Y and $\rho$) from detailed moment analysis. The fundamental transverse mode may be less than one-third that calculated for a fiberglass cylinder as the transverse stiffness can be substantially degraded.

The radial mode is less affected by the addition of a tightly wound copper winding on a cylindrical form than is the transverse mode. Thus, for the typical case where $h=4\ r_f$, with coil mass several times that of the form mass, the transverse frequency may be one tenth of the radial frequency. Table I gives some properties of typical materials.

TABLE I

Materials Properties

| Materials | Density Mg/m³ | Modulus GPa | c m/s |
|---|---|---|---|
| (a) PEEK | 1.3 | 3.6 | 1700 |
| (b) G-10 | 1.5 | 10 | 2600 |
| (c) N66-60G | 1.7 | 20 | 3400 |
| (d) Copper | 9.0 | 130 | 3700 |
| (e) Macor | 2.5 | 62 | 5000 |
| (f) SS304 | 8.0 | 190 | 5000 |
| (g) E-GF | 2.6 | 72 | — |
| (h) Zirconia | 5.7 | 220 | 6200 |
| (i) WC | 15.6 | 660 | 6500 |
| (j) Nextel 440 | 3.1 | 220 | — |
| (k) Alumina | 3.9 | 380 | 9900 |
| (l) PAN-50 CF | 1.8 | 380 | — |

NOTES: (a) Polyetheretherketone; (b) Glass cloth reinforced epoxy; (c) Nylon-6/6, 60% glass fiber; (e) machinable glass, Al-B-Si-K-F-O, Corning Glass Works; (f) stainless steel alloy; (g) standard E-glass fiber; (h) partially stabilized with MgO; (i) typical 1-micron tungsten carbide powder; (j) Al-Si-B-O ceramic fiber, 3M; (k) 99.5%; (l) Thornel PAN carbon fiber.

For mid-sized to large systems ($r_f$ greater than 30 to 300 mm), $\omega_g$ is more likely to be comparable to $\omega_b$ or a higher vibration mode, and it is here that problems arise because the mechanical recovery time becomes long compared to the gradient pulse length. A conventional transverse mid-sized gradient coil on a G-10 fiberglass cylindrical coilform with $r_f=35$ mm, h=200 mm, and w=5 mm would have $\omega_b/2\pi$ in the range of 600 to 1500 Hz, depending on the amount of copper used—unless a Maxwell pair for the z-gradient has been laid in circumferential grooves on the same form, in which case this mode could be below 300 Hz.

For $\omega_g \gg \omega_b$, the motion during a single square pulse of length $t_g$ (where $t_g < 1/\omega_b$) can be approximated as a mass under the influence of a constant force since the coilform stiffness is negligible compared to the coil's inertia. The coil acceleration a during the pulse is $b_1 n_1 I r_f B_0 / m_c$, where $m_c$ is the coil mass per quadrant, $n_1$ is the number of turns per quadrant, and $b_1$ is a dimensionless function of the coil and coilform geometry with typical value near 2. At the termination of the pulse, the coil will be rotating with tip velocity $v = \pm a t_g$. Its mechanical energy is kinetic ($mv^2/2$). Hence, the mechanical energy per quadrant $U_M$ from a single short pulse is given by $$U_M = \frac{(b_1 n_1 I r_f B_0 t_g)^2}{2 m_c} , \qquad (16)$$

since the effective moving mass (half of the coil mass plus adjacent coilform) is comparable to $m_c$ for typical Golay coils on fiberglass coilforms.

We define a dimensionless electro-mechanical, high-frequency efficiency factor $\eta_{mh}$, which we desire to be small:

$$\eta_{mh} = \frac{U_M}{U_S} = \frac{U_M}{\eta_S U_T} . \qquad (17)$$

For the typical case of negligible mutual inductance between quadrants, the above ratio is the same for a single quadrant as for the system, whether series connected or parallel connected.

For shielded Golay coils, with the shield coils at radius $r_f + s$, where s is much less than $r_f$, the inductance per quadrant is approximately $$L \approx 8 \mu_0 n^2 s \qquad (18)$$

Thus $$\eta_{mh} \approx \frac{(r_f B_0 t_g)^2}{2\eta_s \mu_0 s m_c} \quad (19)$$

Clearly, relative mechanical energy during short pulses is minimized by increasing $\eta_s$, s, and $m_c$ for a given $B_0$ and $t_g$. Since $m_c$ would be expected to increase as the third power of $r_f$, it might appear that motion-related problems are reduced by increasing $r_f$. However, $t_g$ (if inversely proportional to $B_G$) will generally increase as the second, third, or even fourth power of $r_f$ in large coils, depending on the severity of acoustic noise and the amount of power that can be justified. Thus, electro-mechanical energy in the short-pulse limit typically increases very rapidly with $r_f$ because the pulse lengths must increase.

While relative high-frequency mechanical energy per pulse ($\eta_{mh}$) is minimized by reducing the pulse length, a proportional increase in the strength of the gradient is required; hence, equation [16] shows that $U_M$ remains unchanged. Moreover, the acoustic spectrum would move into the more troublesome range where the response would be similar to that of a conventional loudspeaker. Another severe problem that often arises for the high-frequency condition is that $\omega_g$ may be close to $\omega_b$, or to one of the higher mechanical modes. The single pulse analysis is invalid near resonance as the initial velocity is no longer zero.

For the earlier mid-sized typical example with $B_0=2$ T, $t_g=0.5$ ms, s=10 mm, and $m_c=0.5$ kg, $\eta_{mh}$ evaluates to approximately 1.6, which means more energy is going into mechanical motion than into gradient energy in the sample. In this case, however, the short-pulse approximations do not apply, as we are close to resonance. Thus, the actual situation is worse by a factor comparable to the mechanical Q, which has been found to lie between 3 and 20 for typical materials and geometries.

Figure 3:
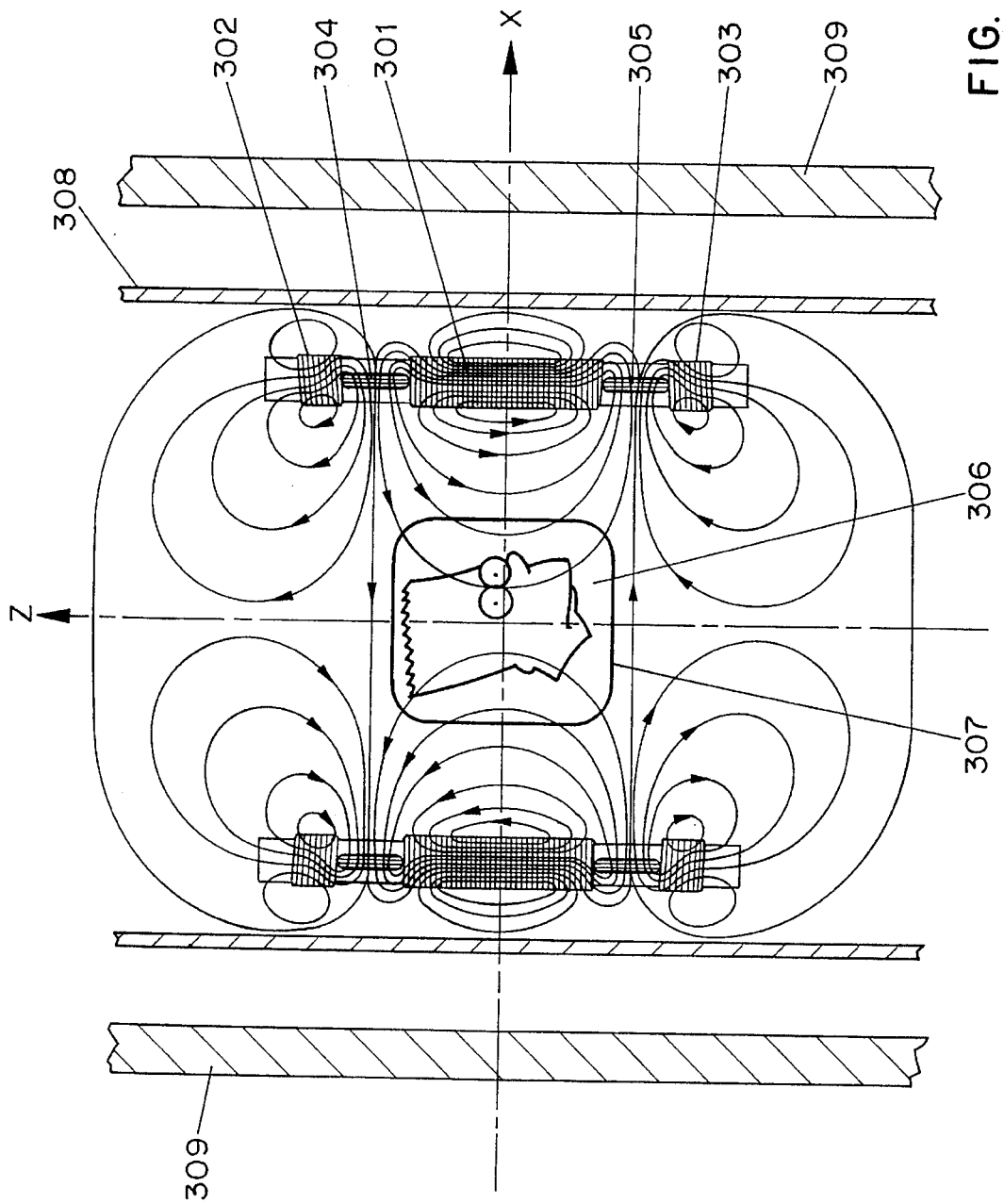
FIG. 3 discloses a pair of opposed solenoidal octopolar coils in longitudinal cross section with typical lines of flux producing a transverse gradient.

The key to reducing both $U_M$ and relative mechanical energy is to change from the Golay geometry to the predominately solenoidal geometry of octopolar coils as shown in FIG. 3. Each octopolar coil consists of a central solenoidal coil 301, two opposed solenoidal end coils 302, 303 adding a quadrupolar field in the z direction but not completely negating the dipolar field of the central solenoid 301, and two cross coils 304, 305 adding a transverse quadrupolar field. The magnetic flux for a properly wound pair of octopolar coils is mostly confined to the region between the coils as shown, which clearly produces the desired, monotonic field over a large sample region 306 inside sample coil 307. The magnetic energy external to the sample region is much less than in unshielded prior art, and the passive gradient shield 308 easily makes residual interactions with the main $B_0$ magnet 309 negligible. Compared to the prior art, the reduced transverse field components of the octopolar geometry substantially reduces electrical hazard to the patient and asymmetrical eddy current interactions with the rf coil 307. Before considering field linearity or the gradient magnitude, we look at the most significant prior-art limitations—mechanical energy and acoustic noise.

The most efficiently driven mode in the octopolar solenoid is the radial mode, but the mean solenoid radius $r_c$ is smaller by a factor of 4 to 15 than the Golay $r_f$ for similar imaging radius $r_i$. Hence the resonant frequency is 10 to 100 times higher than the dominant mode for Golay-type coils. Gradient frequencies may be increased by the same factor before getting into the troublesome regime of equations [16] and [19]. The constant $b_1$ in equation [16] is increased to approximately $\pi$ for a solenoid, and the coefficient in equation [18] is significantly reduced, but this is balanced by a similar increase in $\eta_s$. However, it is now usually possible to stay below resonance, where motion problems are easily eliminated by increasing the stiffness.

The small diameter of the solenoid makes it possible to select coilform materials that would be prohibitively expensive to manufacture at the dimensions required for a Golay coil, where fiberglass forms and ceramic cement encapsulation are used. The radial mode of the solenoid is maximized by choosing a material for its coilform with high Y, such as alumina, mullite, borosilicate glass, a machinable glass such as Macor, or plastics highly loaded with high-modulus fibers of ceramic, carbon, or glass.

The radial force in a solenoid is simply $2\pi r_c nIB_0$ and the inductance of a long solenoid is $\mu_0 n^2 \pi r_c^2/h$. Hence, from equation [14] and the above, the mechanical energy, $F^2/2k$, $U_M$ is $$U_M = \frac{r_c L I^2 B_0^2}{\mu_0 Y w} \quad (20)$$

We may define a low-frequency electro-mechanical efficiency factor $\eta_{ml}$ in the same manner as equation [17] and show that it is $$\eta_{ml} = \frac{2r_c B_0^2}{\eta_s \mu_0 Y w} \quad (21)$$

for the LF solenoid, which has typical value between 0.0001 and 0.01 for coils suitable for whole-body MRI on high-modulus forms at high fields.

The cross coils 304, 305 will also weakly excite a transverse vibration mode, which will be resonant at a much lower frequency. Since the pulse length would often be short compared to the period of this transverse mode, it may be beneficial to select a coilform material that has high density, such as zirconia or a composite loaded with a dense compound such as tungsten carbide (WC) or zirconia fibers. Fortunately, this transverse mode is driven much less efficiently (by about two orders of magnitude) than is the Golay $\omega_b$, for the following reasons: (a) typically only 20% of the total turns are transverse; (b) the mean axial dimension of the cross coils is about half that of Golay coils, which reduces the torque correspondingly; (c) the switching efficiency $\eta_g$ is increased by about a factor of four; (d) the solenoidal coilform can easily be made quite stiff and massive.

Equation [21] is also approximately correct for mechanical evaluation of Maxwell pairs used for the z-gradient. However, compared to the octopolar coils, the z-gradient coil radius will be larger by a factor of four to fifteen, the relative wall thickness may be one tenth as large, $\eta_g$ may be larger by a factor of two, and Y may be smaller by a factor of 2 to 40 for manufacturing reasons. Thus, the z-gradient may have two orders of magnitude larger acoustic problems than the transverse gradients—a reversal from the prior art. Fortunately, the z-gradient is normally used only where the frequency components are very low, as in slice selection or Gradient Enhanced Spectroscopy (GES). An exception has been Pulsed Field Gradient (PFG) diffusion measurement, which may now be performed using a transverse octopolar gradient rather than the z-gradient for minimum motion-related artifacts.

Figure 4:
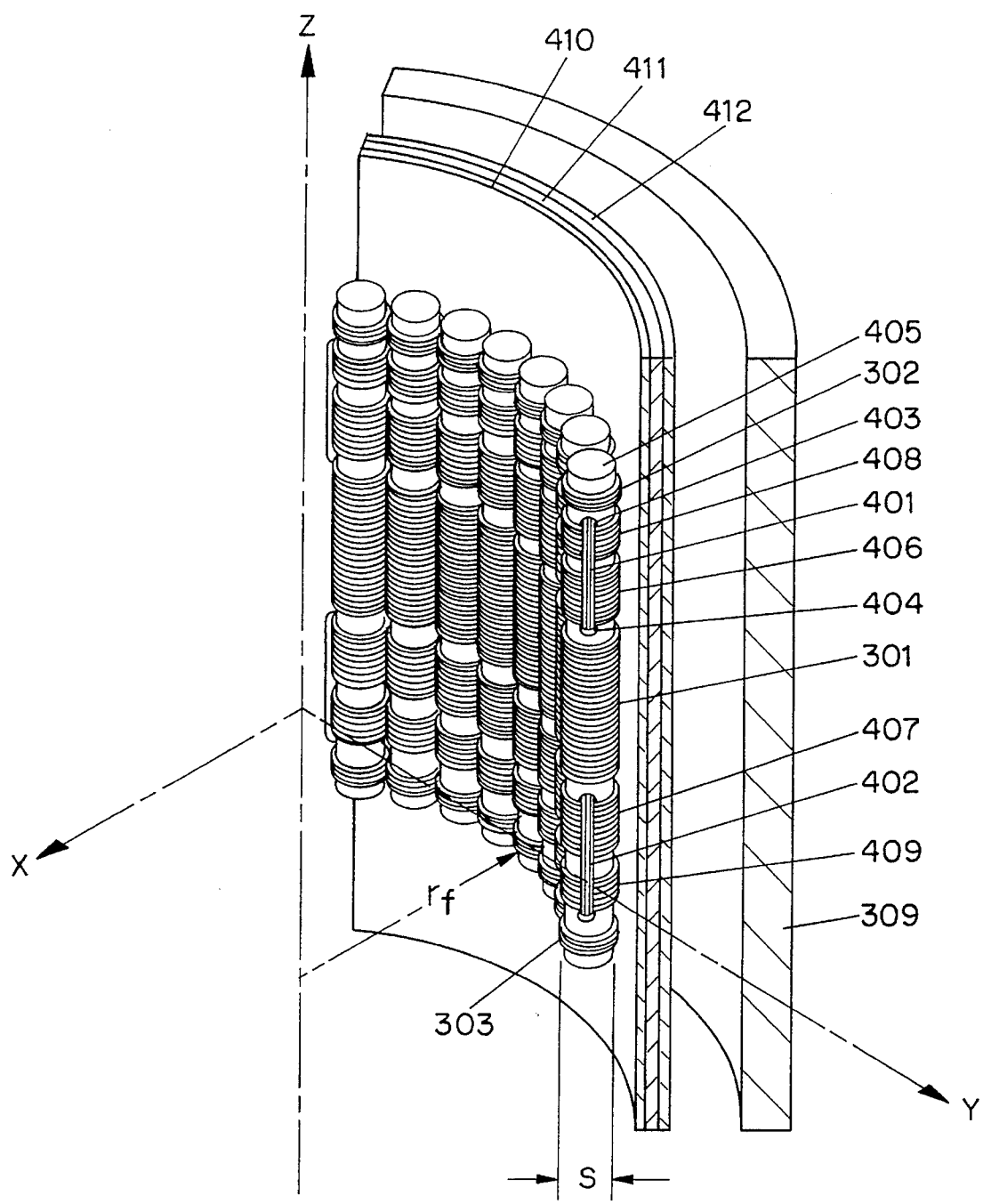
FIG. 4 depicts a quadrant of solenoidal coils with octopolar field inside a passive gradient shield.

Referencing FIGS. 3 and 4, we begin the magnetic analysis by considering a single, azimuthal quadrant of identical octopolar coils, as depicted in FIG. 4, disposed adjacently in a sector with central inside radius $r_f=1.3\ r_i$, outside radius $r_f+s=1.6\ r_i$, with a passive cylindrical shield 308 at radius $r_f+s+\epsilon$ where $\epsilon$ is small compared to s. The relative dimensions selected are convenient for six or eight parallel octopolar coils per quadrant, depending on the shape of the cross section of the central solenoid 301. Instead of winding individual cross coils 304, 305 on each solenoidal coilform, transverse saddle coils 401, 402 may be threaded through the transverse holes 403, 404 in the solenoidal coilform 405 to generate the transverse quadrupolar field with some improvement in LF efficiency but with no significant effect on other parameters. Transverse flux leakage may be reduced by extending the central solenoid 301 into the transverse coil region 406, 407. Transverse and axial flux leakage may be reduced by extending the end coils 302, 303 into the transverse coil region 408, 409. The turns density per unit length near the center of the central solenoid will typically be about 80% of the turns density near the end coils 302, 303 for improved field linearity over a longer sample region.

The total number of turns in the end coils 302, 303 plus their extensions into the transverse region 408, 409 will typically be about one tenth of the total turns per octopolar coil and is selected to minimize axial leakage flux. The number of turns in the cross coils 304, 305 or in the transverse saddle coils 401, 402, whichever are used, is typically about one fifth of the total number of turns and is selected primarily to minimize transverse leakage flux for the system in the absence of the passive shield.

The series inductance $L_1$ of the quadrant of octopolar coils is approximately $$L_1 \approx \frac{\mu_0 n_1^2 r_i s}{h_i}, \quad (22)$$

where $n_1$ is the number of turns on each octopolar coil including the cross coils or Golay coils, and we have assumed $h_i = 1.5\, r_i$ and $s = 0.3\, r_i$ in omitted second order terms.

Most of the turns are linked by approximately equal flux, $\phi_1/n_c$, where $\phi_1$ is the total flux from the quadrant through the $z=0$ plane. With the coils all wired in series, $$\phi_1 \approx \frac{L_1 I_1}{n_1}, \quad (23)$$

where $I_1$ is the series current. For a parallel arrangement, the inductance is decreased by $n_c^2$ and the current is increased by $n_c$, requiring this factor to be added to equation [23].

The average value of the z-component of the magnetic field from one quadrant of coils in the x-y plane at $z=0$, $\langle B_{z1}(0) \rangle$, is easily estimated.

$$\langle B_{z1}(0) \rangle \approx \frac{\phi_1}{A_0}, \quad (24)$$

$$A_0 \approx 2\pi r_i^2 \quad (25)$$

The radial distance $\epsilon$ between the magnetic shield and the coils should be small compared to s, or leakage flux is increased and $B_{z1}$ is decreased slightly, particularly if the number of turns in the transverse coils is not chosen to give optimum first-order shielding.

A more sophisticated approach to calculating the magnetic field, such as numerical integration of the Biot-Savart law, is required to determine $B_{z1}$ as a function of x. However, a reasonable estimate of its value near the x-y plane at $x=r_i$ is twice the average value, and its value at $x=-r_i$ should be about 0.2 times the average value. (The field inside the central solenoids 301 is approximately 10 times that of equation [24].)

Figure 5:
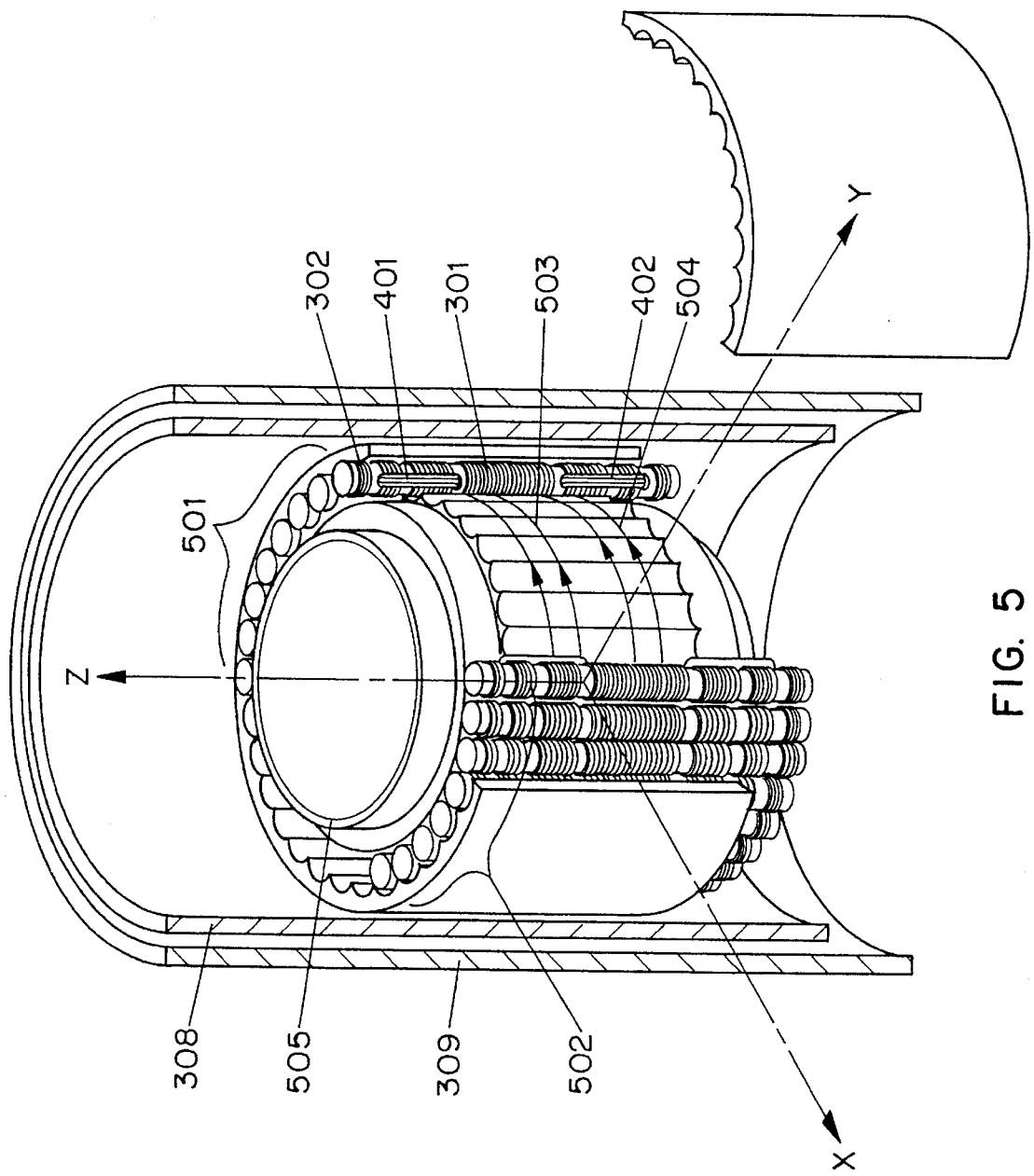
FIG. 5 discloses an octopolar transverse gradient coil assembly for a single transverse axis.

FIG. 5 discloses the transverse gradient coil system of the instant invention, which includes two opposing quadrants 501, 502 of identical octopolar coils with support structure. The coils are energized so that the average value of the axial component of the magnetic field along the central axis is zero; the average value over the central transverse plane is also zero; the dipole moment of the total magnetic field produced by the coil system is zero; the highly localized fields result in a much smaller quadrupole moment than for Golay coils of similar size; and there are substantial octopole and higher multipole moments.

Eddy currents are induced in the passive cylindrical gradient shield 308 such that the gradient field is confined to the central region when the shield thickness is greater than the skin depth $\delta$. The relatively low-level eddy currents induced by the octopolar coils do not present major problems if the shield rigidity and mass sufficiently limit coupling to acoustic resonances. It is primarily the acoustic modes, rather than the directly induced eddy currents, that have time constants long enough to cause image artifacts that cannot be addressed by pulse shaping. The main exception to this rule is the zero-order $B_z$ or solenoidal component induced by imperfections in the gradients, which has a decay time constant on the order of $r_i t_g^{0.5}$ [$s^{0.5}$/m] for thick-walled copper cylinders. But this low-level homogeneous shift is easily nulled with a low-power zero-order (quasi-Helmholtz) $B_z$ coil 503, 504 of radius less than that of the gradient shield 308 but larger than that of the internal rf shield 505.

The energy stored in the acoustic resonances in a strong external magnetic field is responsible for the persistence of the complex eddy currents via microphonic interactions. The eddy current time constant may be decreased by using a high-resistivity alloy for the shield such as austenitic (non-magnetic, 300-series) stainless steels (about 20% Cr, 10% Ni) or by resistive damping as described later. The acoustic time constant is decreased by using a shield with high velocity of sound, high stiffness, and high mechanical loss factor. Improved shielding may be obtained by including a copper or aluminum cylinder, as the skin depth in alloy AISI 304 (UNS S30400) at 20 Hz is about 100 mm while the skin depth in copper is only 15 mm. A copper cylinder 410, with 3 to 30 mm wall thickness, a stainless steel cylinder 412, of 2 to 20 mm wall, and a composite resin cylinder 411 therebetween, with resin cylinder thickness less than one half of the total wall thickness, provides a good balance of high stiffness, high conductivity, low permeability, high acoustic damping, and low cost. Performance is a little better with the copper or aluminum on the inside, but either way provides an effective, passive shield.

The eddy current energy of the instant invention is an order of magnitude lower than that of the unshielded prior art, which greatly reduces the gradient power demands imposed by multi-exponential eddy current compensation techniques. Additional active shielding, beyond optimization of the end coils 302, 303 and transverse coils 401, 402, is not necessary.

The difference between the $B_z$ values at +x and 0, according to the previous estimate, is about twice the average value of equation [24]. With all the coils electrically wired in series, the total inductance $L_T$ is about $2L_1$ and the total current $I_T$ is $I_1$. The gradient coefficient $\alpha$ is easily estimated.

$$\delta B = \frac{\beta L_T I_T}{n_1 r_i^2}, \quad (26)$$

$$\alpha = \frac{\delta B}{r_i I} = \frac{\beta L_T}{n_1 r_i^3}, \quad (27)$$

Our estimate of the field slope implies that $\beta \approx (2-0.2)/4\pi \approx 0.14$. (Factors of $n_c$ are required to make equations [22] through [28] valid for parallel arrangements.) Substituting into equation [4] gives $$\alpha = 2 \frac{\beta \mu_0 n_1 s}{h_i r_i^2}, \quad (28)$$

$$\eta_s = \frac{\beta^2 L_T}{\mu_0 n_1^2 r_i}, \quad (29)$$

$$\eta_s \approx 2 \frac{\beta^2 s}{h} \approx 0.005. \quad (30)$$

Equations [29] and [30] are dimensionless and valid for either series or parallel arrangements. The switching efficiency is clearly independent of $n_1$ and $n_c$, and it is two to five times larger than for shielded Golay-type coils of comparable s/h.

Another approach to understanding the reason behind the higher switching efficiency of the octopolar coil compared to the Golay coil is to note that only 5% to 15% of the total conductor length is parallel to $B_z$. By contrast, about 40% of the conductor length in the Golay coils is parallel to $B_z$ with totally useless magnetic field. This has not been perceived to be a problem in the prior art because no forces are generated by those conductors parallel to the external field. However, the parallel conductors not only generate harmful field components in the sample and in the rf coils, they are responsible for torques and hence the acoustic problems. Increasing s and reducing h in equation [30] increases the switching efficiency but the percentage of conductor length parallel to $B_z$ increases. The percentage of conductor length substantially parallel to $B_z$ should be kept below 20% for satisfactory control of transverse fields and acoustic problems. Decreasing h has the advantage of limiting the field of view and thus reducing the biological hazards from large switching fields.

It should be noted that decreasing the axial field of view by 30% would seldom be a disadvantage, as the 50-ms snapshots possible with EPI would permit the patient to be smoothly conveyed through the imaging zone with little difficulty in treating motion-related artifacts. Proper signal averaging and registration of successive images could readily be achieved.

As the prior art has often been concerned with reducing inductance, we note that the octopolar coils can achieve two orders-of-magnitude lower inductance than Golay-type coils before shielding problems become significant. The total number of turns can be as small as 40 per octopolar coil without excessive flux leakage. The minimum inductance is thus about $2\mu_0 r_i$, or under 1 µH for a whole-body parallel octopolar coil system, but the performance per cost of the driver is usually best for 0.2 to 1 mH.

Orthogonality between the three axes should be within 0.01% for EPI. Achieving this degree of orthogonality directly is beyond reasonable manufacturing tolerances, but an external variable coupling (cross-term) circuit at the input of the gradient drivers can be used to null residual magnetic couplings. Maintaining magnetic orthogonality over a typical range of 5 Hz to 5 kHz requires a high degree of precision in the symmetry of the passive gradient shield, the internal rf shield, and the rf coil. Electric field interactions between the axes can easily be made smaller than 0.05% by using balanced coil drivers with low inductance gradient systems (below 1 mH). Winding each quadrant in a series-parallel fashion that leaves the low-voltage points at the edges of the quadrants and the high-voltage points at the centers of the quadrants makes it easy to achieve another order of magnitude reduction in electric field coupling. A typical winding would be 100 to 200 turns per octopolar coil, with half of the octopolar coils per quadrant connected in series and paralleled with the other half.

As can be appreciated by one experienced in the manufacture of Golay coilforms and the winding of Golay coils, the solenoidal octopolar coils are much easier to produce, especially with the high degree of accuracy necessary for precise shielding, axis orthogonality, and low homogeneous shift.

The DC resistance of the series-connected octopolar gradient system is easily shown to be $$R_E \approx 15 \frac{n_1^2 \rho r_i}{c_i h_i}, \quad (31)$$

where $\rho$ is the conductivity of the wire and $c_i$ is the conductor thickness in the coils, for $c_i$ less than the skin depth. Substituting equations [28] and [31] into equation [10] gives the following low frequency efficiency:

$$\eta_L \approx \frac{\beta^2 \sqrt{\omega} \, \mu_0 c_i s^2}{5 h_i r_i \rho}. \quad (32)$$

At 100 Hz, the above expression simplifies to approximately 0.3 $c_i/r_i$ for the previous conditions. For $c_i$=6 mm and $r_i$=300 mm, this evaluates to 0.005 and is an order of magnitude larger than for typical prior-art, whole-body MRI transverse gradients. The figure of merit governing power dissipation during EPI is $\eta_s Q$. For the above solenoidal octopolar coil geometry, $$Q \approx 0.25 \frac{s}{\delta}, \quad (33)$$

where the skin depth $\delta$ is assumed to be small compared to $c_i$, and other losses are small. For the previous example, the Q is about 15 at 1600 Hz since $\delta$=1.6 mm. The coefficient in equation [33] varies between 0.1 and 0.4 for shielded Golay coils, depending primarily on the conductor surface area and the degree of linearization.

Another qualitative method of evaluating coil shielding problems is to measure the change in inductance when a passive shield is added. For the unshielded Golay coils, a passive shield with inner radius 1.3 $r_f$ typically reduces the inductance by 25%. For the shielded Golay coils, a passive shield at radial distance c from the shield coil, where $\epsilon$=0.03 $r_i$, may reduce the inductance by under 0.5% for high-inductance coils, but several percent is more typical for low-inductance coils. For the octopolar coils without additional shielding coils, the passive shield at $\epsilon$=0.03 $r_i$ reduces the inductance by several percent. The addition of low-power Golay shielding coils can reduce the effect of the passive shield on inductance change by another order of magnitude.

Finally, we note that linearity over the sphere of radius $r_i$ for the conditions previously assumed is easily better than ±30%. With proper control of winding densities, especially in the solenoidal coils extending into the cross coil regions, linearity can be better than ±20%. Where space permits, increasing $s/r_f$ improves linearity as well as efficiencies. Optimized winding densities that balance efficiencies, flux shielding, and linearity may be determined by prior-art iterative techniques using the above equations and standard numerical integration of the Biot-Savart law.

FIG. 6 discloses a shielded axial gradient coil system with concentric support members 601. It is important that the z-gradient coils 602 and z-gradient shield coils 603 be wound on coilforms of high-modulus materials and rigidly joined through the concentric support members 601 to minimize their motion-related artifacts and acoustic noise. One of the stiffest thermoplastics readily available is nylon 6/6 reinforced with 60% long glass fiber. Further increase in modulus may be achieved by using a high-strength alumina-silica-boria ceramic fiber such as 3M's Nextel 480, or zirconia fibers, or alumina fibers instead of glass fibers. The low shear strength of such fibers results in low impact strength, which may facilitate machining. Improved impact strength can be achieved by using a thermoset resin such as polyester or epoxy with a room-temperature cure process allowing high-modulus carbon fibers to be substituted for a fraction of the ceramic fibers. Carbon fiber content must be kept below 15% or electrical conductivity becomes large enough to cause excessive eddy current losses. Low-temperature cures are required because of the differential thermal expansion between carbon and ceramic fibers which places the ceramic fibers under tensile stress upon cooling. A preferred composite would include at least 5% carbon fibers and at least 25% ceramic fibers by mass.

For best results, the wires should be securely bonded to the forms with epoxy containing at least 5% carbon fiber to improve both thermal conductivity and modulus. At least 10% other non-conductive, high-modulus fiber having elastic modulus greater than 60 GPa, such as ceramic fiber or glass fiber, is beneficial for further increase in modulus.

FIG. 7 discloses a quadrant of an axial cross section of the typical x-y-z gradient system of the instant invention, which is symmetric with respect to a 180° rotation about the z-axis and symmetric with respect to a reflection through the x-y plane. The solenoidal coilforms 405 function as concentric support members and support the central solenoids 301 and transverse saddle coils 401. Z-gradient motion is reduced by bonding the outside of the z-gradient coilform 704 to the inside of each of octopolar coils 405 and bonding the inside of the z-shielding coilform 705 to the outside of each of the octopolar coils 405. The radial forces from the axial gradient coils 706, 707 are opposite those of the axial shielding coils 708, 709, 710 and coupled through the highly rigid solenoidal coilforms. As a result, only the residual net force, which is about half of the radial force of the gradient coils, produces significant motion.

The external passive gradient shield 701, 702, 703, corresponding to shield 308 substantially eliminates eddy current effects (cryogen boiling and field distortions) in the magnet. It includes copper cylinder 410, resin cylinder 702, and stainless steel cylinder 703, corresponding to the above mentioned 410, 411, and 412.

A low-power quasi-Helmholtz zero-order shim coil 503 may be added for real-time cancellation of the minute solenoidal eddy currents caused by imperfections in the gradients. Placing this $B_0$ correction coil inside the passive gradient shield 308 is far more effective than attempting to adjust the current in the main magnet $B_0$ windings to cancel offsets from eddy currents, as suggested by Kondo in U.S. Pat. No. 5,055,789, or by using the standard $B_0$ shim coil provided inside the magnet cryostat. A zero-order shield coil 712 is added to simplify the time dependence of the offset correction. The axial location of the zero-order shim coil 503 and its symmetric counterpart are centered approximately at $\pm z = 0.55\ r_f$ to improve homogeneity in the presence of the zero-order shield coil 712. The x-y-z gradient coils may be used for cancellation of first-order gradients from eddy currents by pulse shaping as described by Van Vaals et al.

Second-order, time-dependent correction to $B_z$ is also beneficial An orthogonal $B_z^2$ shim coil could consist of the second order shim coils 713, 714. Coil 713 is centered about the origin and contains $I_2$ amp-turns. Coil 714 and its symmetric counterpart could be centered at $\pm z = 1.1\ r_r$ and each contain $0.5 I_2$ negative amp-turns for minimum dipole moment. Second-order shield coils 715, 716 are added to simplify time dependence. Fine conductors are sufficient for the zero-order and second-order shim and shield coils, as they are required only to generate fields less than 0.01% of $B_0$, while the x-y-z gradient fields may exceed 10% of $B_0$. Higher-order, time-dependent, shielded shim coils would seldom be beneficial owing to the extremely short time constants of the higher-order eddy current modes.

The inside of the gradient coilform must be lined with an rf noise shield 717, 718, for optimum sensitivity and rf tuning stability. Pure copper or silver foil, about 0.1-mm thick, is sufficient for rf noise shielding above 12 MHz. Eddy current problems, except for zero-order $B_z$, are not too significant at this foil thickness, and microphonic problems are controlled by securely bonding the foil to the rigid coilform. An improvement in gradient efficiency at higher switching frequencies and a reduction of eddy currents may be obtained by using a copper alloy foil with high electrical resistivity, such as high-silicon bronze alloy C65500, where $\rho \approx 250$ n$\Omega$m, or type 330 stainless steel, where $\rho \approx 1000$ n$\Omega$m, compared to 17 n$\Omega$m for copper, but other alloys with resistivity above 100 n$\Omega$m would also be quite advantageous compared to copper for rf noise shielding and eddy current damping—i.e., the high-resistivity foil is effectively a shunt resistor inductively coupled into the eddy current field. The foil thickness may be increased by the square root of the increase in resistivity to typically 0.2 to 1-mm for equivalent noise shielding. The rf Q of small MRI surface coils would not be significantly affected by the high-resistivity noise shield, and a 0.01-mm to 0.03-mm silver plate on the inside surface of the noise shield is sufficient to maintain high Q in large rf coils. The increased inside diameter of the rf shield in the central region 717 compared to the end region 718 allows maximum rf performance by providing the largest possible volume outside the rf coil 307 for rf flux return (effectively increasing the rf filling factor by reducing the external flux density and hence the integral of $B^{12}$ over the external volume) while making more space available for support of the axial gradient coils 706, 707.

It is in fact possible to eliminate all saddle coils, cross coils, shim coils, and axial gradient coils and simply utilize the axial solenoids to generate transverse gradients when $s/h_i$ is large, the passive shield is long, and end coils 302 are used to generate an axial quadrupolar field. The eddy currents then induced in the passive shield produce the desired octopolar field. An even number of solenoidal-like axial coils is required—preferably 4n, where n is an integer. The solenoid cross sections may be round, trapezoidal, or elliptical. They are positioned such that the distance between the central z-axis and each axial coil axis is greater than the major diameter of the solenoids. Opposed currents are applied to the solenoids to generate a transverse gradient.

Figure 8:
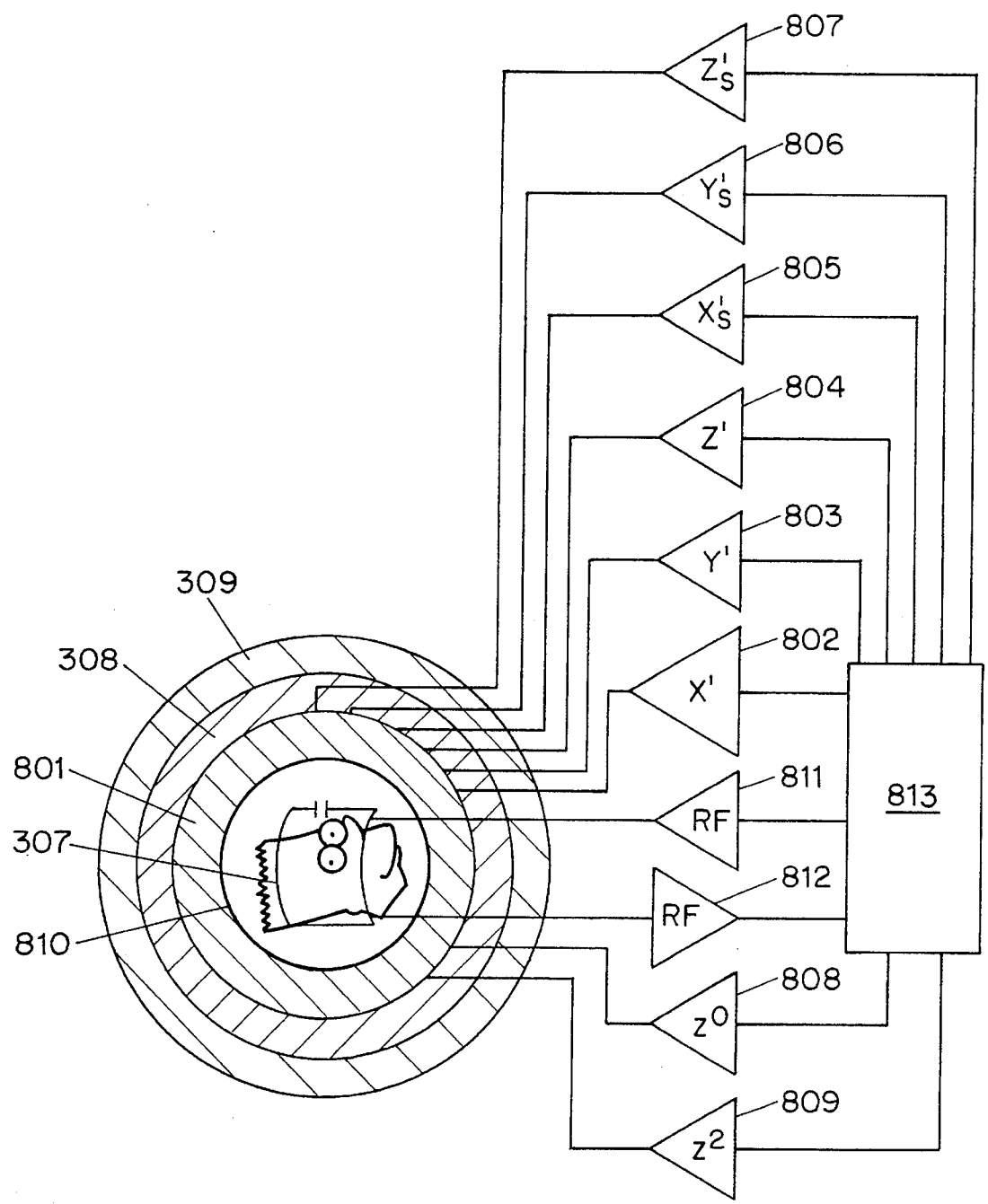
FIG. 8 is a schematic MRI system representation.

FIG. 8 is a schematic representation identifying those portions of the MRI system most directly related to the instant invention. The superconducting magnet 309 and cryoshims are fully persistent, requiring no real-time control because the highly localized flux from the actively shielded gradient system 801 in cooperation with the passive shield 308 effectively eliminates eddy currents in the magnet. The frequency-encoding gradient driver 882 would typically be rated at several hundred kilowatts, DC to 20 kHz, and its gradient coil may be tuned to 1 to 2 kHz. The other gradient drivers 883, 804 would typically be rated at five kilowatts, but hundreds of kilowatts could be used for greater flexibility. Much less power is required for the optional transverse shield-coil drivers 805, 806 and axial shield driver 807. The real-time offset shim driver 808 and real-time $z^2$ shim driver 809 would typically be ultra-quiet DC-50 kHz amplifiers rated less than 100 W continuous. A high-resistivity noise shield 818 isolates the tuned rf coil 387 from the gradient noise and helps damp eddy currents. The nuclei in the sample are magnetized by rf pulses at the mean Larmor frequency from a high-power rf amplifier 811, and the precession signals are amplified by low-noise preamp 812 and processed by the computer 813.

Figure 9:
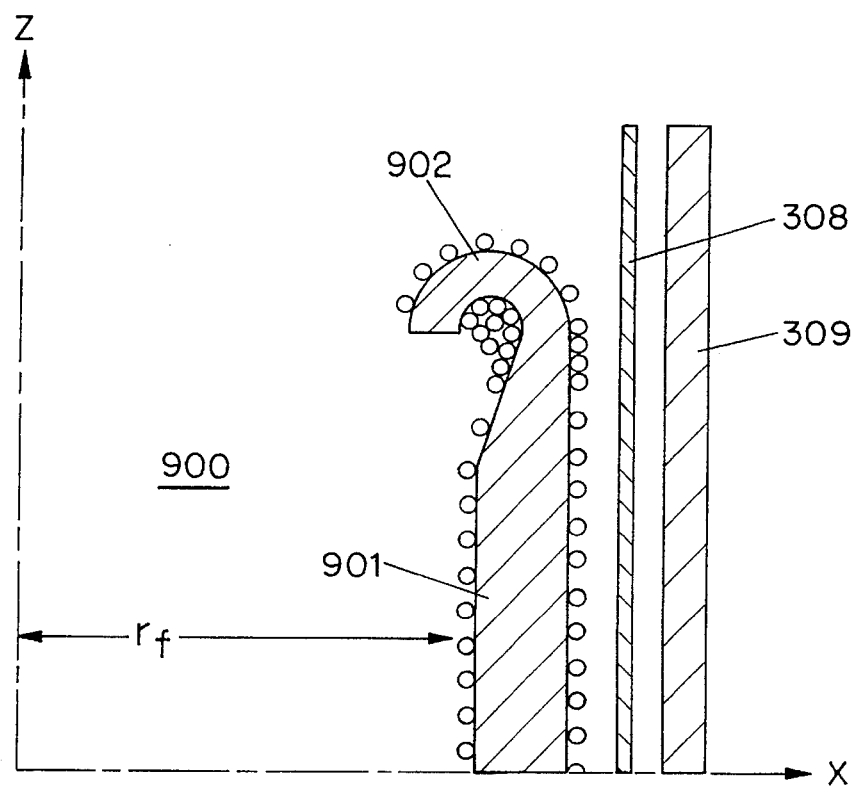
FIG. 9 discloses a c-coil transverse gradient system.

FIG. 9 discloses a quadrant of a longitudinal cross section of a c-coil embodiment of the instant invention for the generation of transverse gradients. Non-ferromagnetic c-coils 988 rather than solenoids, are symmetrically distributed around the inside perimeter of a passive shield 388 inside the bore of a superconducting magnet in a fashion similar to that depicted in FIGS. 4 and 5. The passive shield 308 prevents significant interaction with the magnet, and eddy current effects may be canceled with gradient pulse shaping according to the prior art and time-dependent zero-order and second-order shim coils as described previously. Partial-toroidal section 902 at each end of a central solenoidal section 901 reduces flux leakage. Performance is substantially better than prior aft transverse gradient coils with respect to acoustic noise and manufacturability but efficiencies and linearity are inferior.

Figure 10:
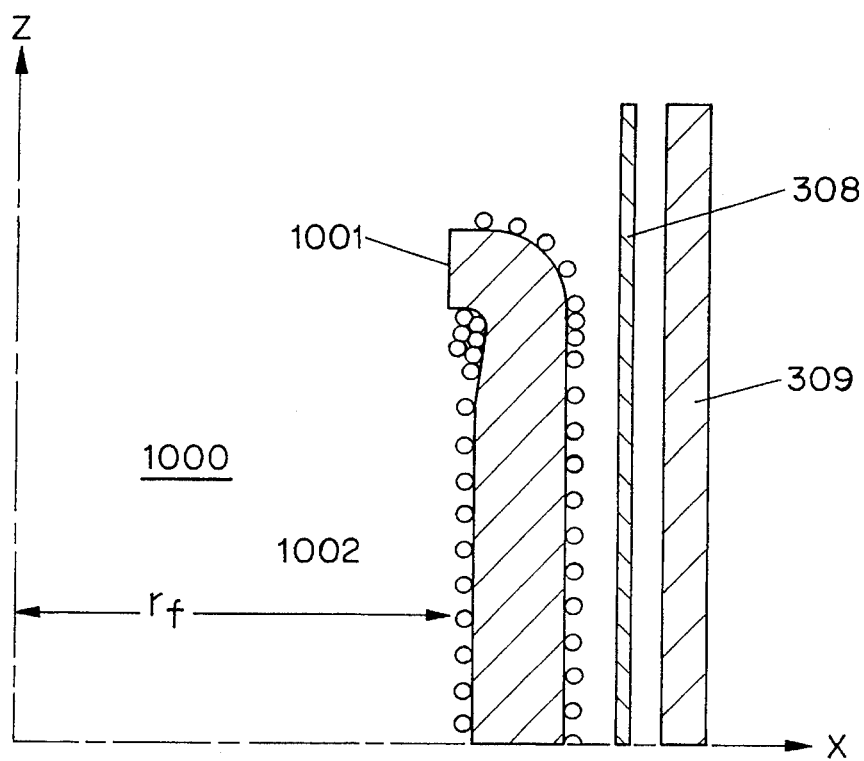
FIG. 10 discloses a U-coil transverse gradient system.

FIG. 10 discloses a quadrant of a longitudinal cross section of a u-coil embodiment of the instant invention for the generation of transverse gradients. U-coils 1000, comprising an axial central solenoidal section 1002 and a transverse section 1001 at each end, are symmetrically distributed around the inside perimeter of a passive shield 308 inside the bore of a superconducting magnet in a fashion similar to that depicted in FIGS. 4 and 5. Performance is somewhat inferior to that of the octopolar coils of FIG. 4 but generally better than that of the c-coils of FIG. 9.

Figure 11:
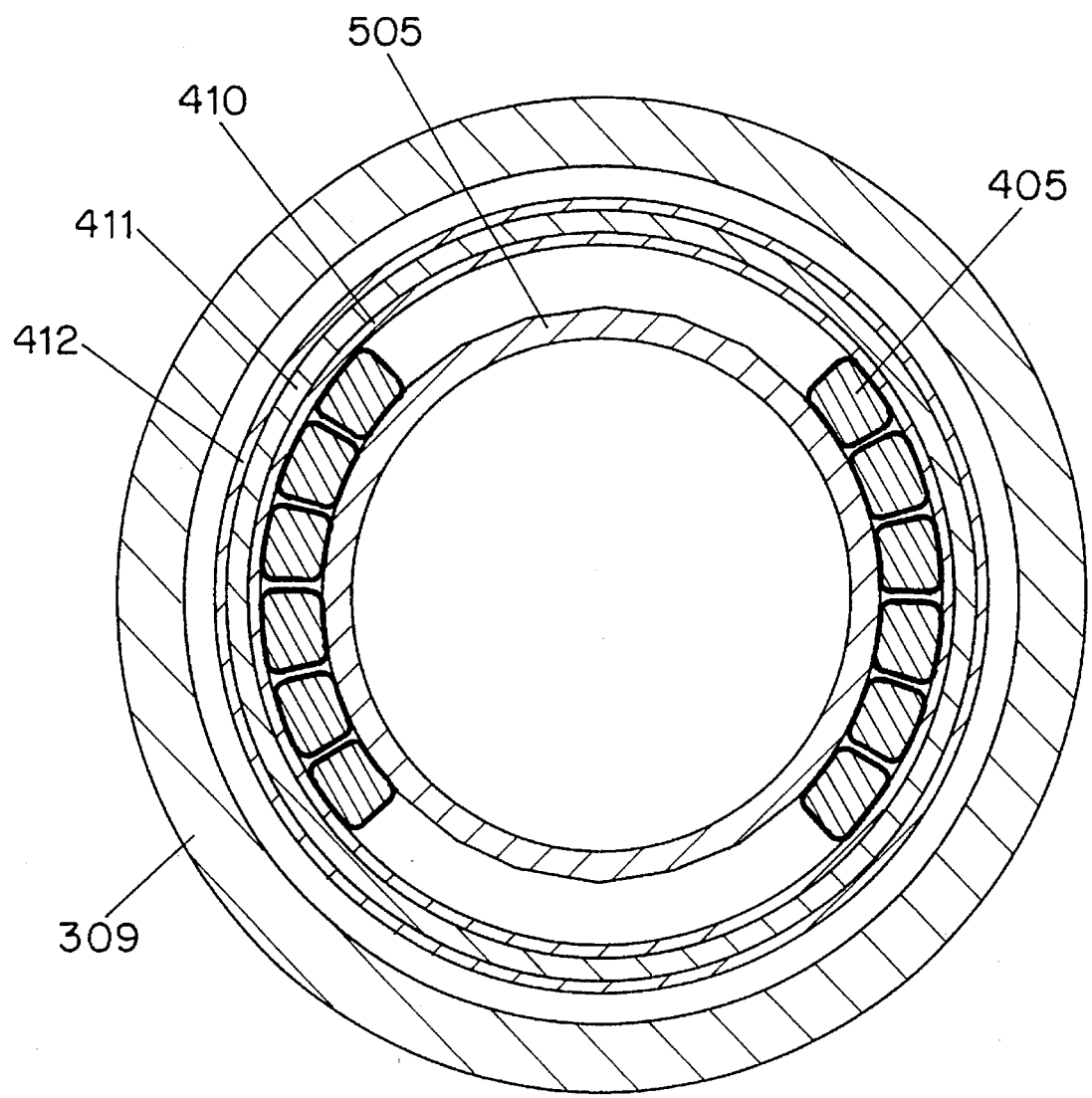
FIG. 11 shows an axial end view of the structure of FIG. 5.

Turning now to FIG. 11, there is shown an axial end view of the structure of FIG. 5. As was mentioned above in connection with FIG. 7, the solenoidal coilforms may be in cross section round, trapezoidal, or elliptical. FIG. 11 shows the trapezoidal configuration, with trapezoidally shaped solenoid coilforms 405 which offers higher gradient coefficient as the ratio of the mean distances from the sample to the outer and inner current elements responsible for the gradient has increased. Also, the space available for external flux has increased, thus reducing the energy in the external field. The cross section is not a true trapezoid, as the edges are radiused and the flats are slightly convex to facilitate coil winding.

As was described above in connection with FIG. 7, one embodiment of the solenoid is to have the transverse coil 401 interleaved with a portion of the central solenoid 301 and interleaved with a portion of the end coil 302. As mentioned above, this interleaving reduces transverse and axial flux leakage. The central solenoid is partitioned into 2n+1 parts, and the end coil is partitioned into n+1 parts, where n=1.

Figure 12A:
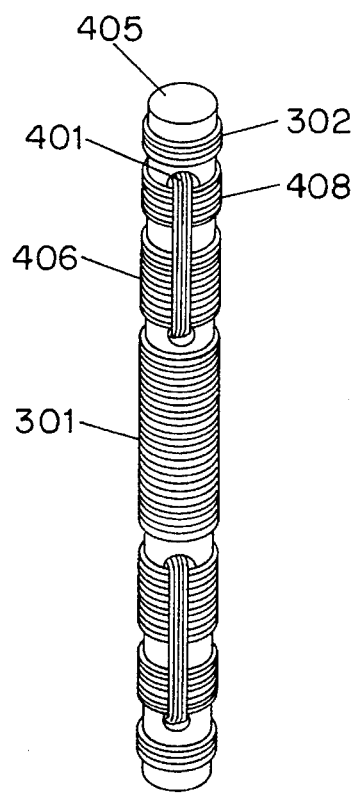
FIG. 12 shows an alternative embodiment for a coil assembly.
Figure 12B:
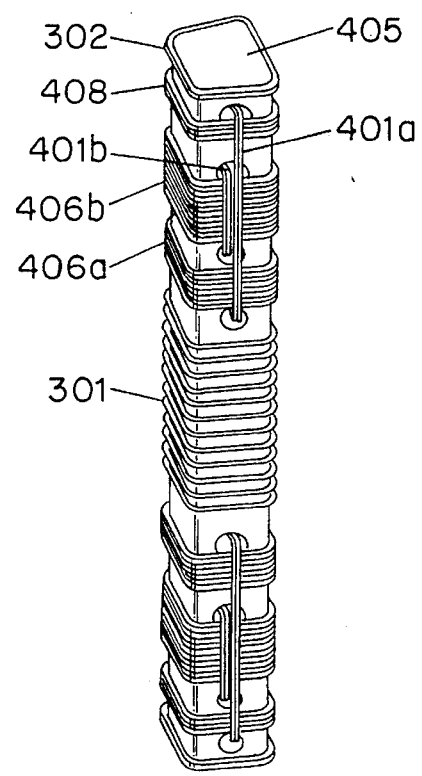

However, those skilled in the art will appreciate that a slightly more Complex solenoid configuration would reduce flux leakage still further. FIG. 12 illustrates at (b) such an alternative embodiment for a coil assembly where n=2 for the central solenoid but n=1 for the end coil. At (a) is seen a side view of a coilform 405 such as appears in FIG. 7. As described previously, end coil 302 has been partitioned physically into coils 302 and 408, and central solenoid 301 has been partitioned physically into coils 301 and 406, while transverse coil 401 is interleaved, passing for example between coils 302 and 408, and between coils 301 and 406. At (b) is seen a corresponding side view of the more complex solenoid configuration. End coil 302 has been partitioned physically into coils 302, 408, and central solenoid 301 has been partitioned physically into coils 301, 406a, and 406b. Transverse coil 401 is partitioned into coils 401a and 401b. As shown at (b), transverse coil 401a is interleaved, passing for example between coils 302 and 408, and between coils 301 and 406a. Transverse coil 401b is interleaved, passing for example between coils 408, and between coils 406a and 406b. Thus the central coil is in five parts, and each end coil is in two parts.

Many variants are possible without departing from the basic principle of interleaving. For example, for n=2 for the end coil, coil 408 in the structure at (b) would be divided into two parts, with an upper portion as shown and a lower portion inside coil 401b adjacent to coil 406b. Alternatively, with n=3 for the central solenoid, coil 301 in the structure at (b) would be divided again, with another cross coil 401c.

Still further variants may be found in interleaving with finer structure, for example, where n has values higher than 2. Flux leakage would be reduced still further, though with the tradeoff of a more complex structure for the coil.

It will be appreciated that the reflective symmetry requirement for the solenoid entails that central solenoid 301 is partitioned into an odd number of coils, namely 2n+1.

Figure 13:
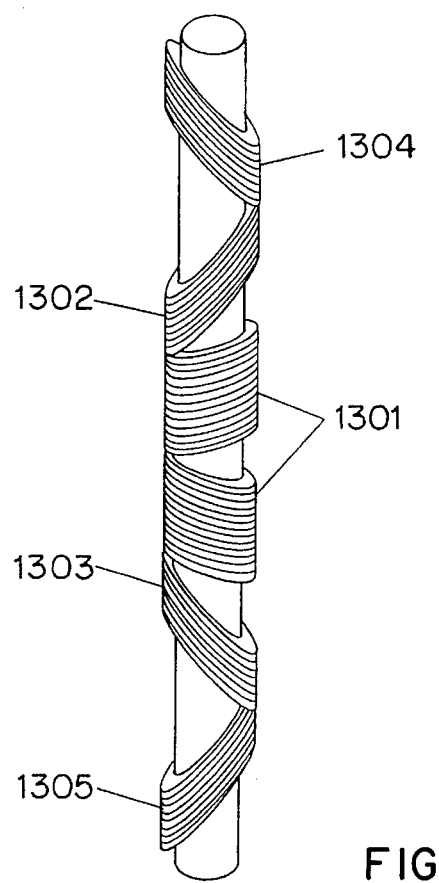
FIG. 13 shows an alternate embodiment for a coil assembly having inclined solenoidal windings.

FIG. 13 illustrates an alternative embodiment for a coil assembly in accordance with the invention wherein an octapolar field is obtained without the use of radially aligned cross coils. The solenoidal-like windings are inclined at pronounced, symmetric angles at opposite ends 1302, 1303 of the central solenoid 1301. Orthogonal fields are produced by the inclined end coils 1304, 1305. These octopolar coils are distributed around the perimeter of the bore of the superconducting magnet in the manner illustrated in FIGS. 4 and 5 for octopolar solenoids having radially aligned cross coils.

Although this invention has been described herein with reference to specific embodiments, it will be recognized that changes and modifications may be made without departing from the spirit of the present invention. All such modifications and changes are intended to be included within the scope of the following claims.

I claim:

1. A non-ferromagnetic transverse gradient coil system having a central axis, said system comprising:

an even number of solenoidal-like central axial coils having a major diameter wound on rigid coilforms having axial coil axes parallel to said central axis and positioned such that the distance between said central axis and each said axial coil axis is greater than the major diameter of said axial coils, the coils arranged in two groups, the groups substantially symmetrical to each other with respect to 180° rotation about the central axis, the coils being substantially symmetrical with respect to reflection through a plane perpendicular to said central axis.

2. The coil system of claim 1 wherein each of said axial coils further characterized by having turns density at symmetrical non-central locations greater than the turns density near its center.

3. The coil system of claim 1 wherein each of the groups of coils further comprises a pair of saddle coils symmetrically disposed one near a first end of the axial coils and the other near the other end of the axial coils, said saddle coils having axes aligned substantially radially from said central axis.

4. The coil system of claim 1 in which each axial coil further comprises end coils coaxial with the central coil thereof and symmetrically secured beyond the end of said central coil.

5. The coil system of claim 1 further comprising a metallic shield cylinder having electrical conductivity less than 30 nano-ohm-meters symmetrically surrounding said coil system.

6. The coil system of claim 1 in which said rigid coilforms are made from a nonmetallic material have elastic modulus greater than 12 GPa and density greater than 2 g/cm$^3$.

7. The coil system of claim 1 in which said central coils are further characterized by having windings inclined with respect to the coil axis.

8. The coil system of claim 1 in which said rigid coilforms have substantially trapezoidal cross-section.

9. The coil system of claim i further comprising a plurality of cross coils disposed at each end of said central coils, said cross coils having axes aligned substantially radially.

10. The coil system of claim 9 in which said axial coils generate a transverse gradient field and in which said saddle coils, when energized, generate a transverse quadrupolar field such that said transverse gradient field is increased in said central region.

11. The coil system of claim 10 in which said end coils and said central coils, when energized, generate a magnetic field with a substantial axial quadrupolar component.

12. The coil system of claim 1 in which said rigid coilforms have substantially round cross-section.

13. The coil system of claim 1 in which said coilform made from a material selected from the set consisting of alumina, silicon nitride, zirconia, alumina-silica-boria glasses, borosilicate glasses, machinable glasses, plastic composites having at least 10% carbon fiber content, plastic composites having more than 25% ceramic fiber content, and plastic composites having density greater than 2.0 g/cm$^3$.

14. An x-y gradient coil system comprising first and second non-ferromagnetic transverse gradient coil systems, each transverse gradient coil system being substantially symmetrical with respect to 180° rotation about a central axis and substantially symmetrical with respect to reflection through a plane perpendicular to said central axis, each said transverse gradient coil system comprising an even number of solenoidal-like central axial coils having a major diameter wound on rigid coilforms having axial coil axes parallel to said central axis and positioned such that the distance between said central axis and each said axial coil axis is greater than the major diameter of said axial coils, each of said axial coils further characterized by having turns density at symmetrical non-central locations greater than the turns density near its center, the central axes of the transverse gradient coil systems being coincident, the transverse gradient coil systems being oriented orthogonally to each other, whereby said x-y coil system is capable of producing transverse gradients in the central axial field in two orthogonal directions.

15. The coil system of claim 14 in which said central axial coils are substantially round in cross section.

16. The coil system of claim 14 in which said central axial coils are substantially trapezoidal in cross section.

17. A gradient coil system for use in magnetic resonance imaging employing a superconducting magnet to establish a magnetic field $B_z$, said coil system comprising:

current conducting elements disposed to generate a transverse gradient in $B_z$, said conducting elements arranged such that they are substantially nonparallel to $B_z$ over more than 80% of their total length;

a rigid form to support said conducting elements; and said conducting elements further comprising:

a plurality of loops having dipole moment parallel to $B_z$;

a plurality of loops having dipole moment perpendicular to $B_z$;

said loops arranged substantially symmetrically with respect to a 180° rotation about the z axis and substantially symmetrically with respect to a reflection through a plane perpendicular to said axis.

18. The coil system of claim 17 in which said loops having dipole moment parallel to $B_z$ are substantially round.

19. The coil system of claim 17 in which said loops having dipole moment parallel to $B_z$ are substantially trapezoidal.

20. A non-ferromagnetic elongate U-coil for producing an external localized flux region, said U-coil comprising:

a central substantially solenoidal coil wound on a coilform of length $h_S$ and major diameter $d_S$ and having a mean first axis of symmetry;

two transverse coils, one disposed at each end of said central solenoidal coil, having axes perpendicular to said first axis, and having outside diameter $d_T$ and axial length $h_T$ such that $h_T$ is less than $d_S$.

21. The U-coil of claim 20 in which each said transverse coil comprises a cross coil, each said cross coil wound on the coilform.

22. The U-coil of claim 20 in which each said transverse coil comprises a saddle coil portion, said saddle coil portion comprising conductors threaded through transverse holes in the coilform.

23. The U-coil of claim 20 in which said central solenoidal coil is substantially round in cross section.

24. The U-coil of claim 20 in which said central solenoidal coil is substantially trapezoidal in cross section.

25. The U-coil of claim 20 in which said coilform is made from a material selected from the set consisting of alumina, silicon nitride, zirconia, alumina-silica-boria glasses, borosilicate glasses, machinable glasses, plastic composites having at least 10% carbon fiber content, plastic composites having more than 25% ceramic fiber content, and plastic composites having density greater than 2.0 g/cm$^3$.

26. A gradient coil system comprising a plurality of U-coils, each U-coil comprising a central substantially solenoidal coil wound on a coilform of length $h_S$ and major diameter $d_S$ and having a mean first axis of symmetry, and two transverse coils, one disposed at each end of said central solenoidal coil, having axes perpendicular to said first axis, and having outside diameter $d_T$ and axial length $h_T$ such that $h_T$ is less than $d_S$, said U-coils distributed about a central axis in two groups, the groups disposed substantially symmetrically with respect to a 180-degree rotation about said central axis and substantially symmetrical with respect to a reflection through a plane perpendicular to said central axis.

27. The system of claim 26 in which each said transverse coil comprises a cross coil, each said cross coil wound on a respective solenoidal coilform.

28. The system of claim 26 in which each said transverse coil comprises a saddle coil portion, said saddle coil portion comprising conductors threaded through transverse holes in the solenoidal coilform; the saddle coil portions together defining transverse saddle coils threaded through the transverse holes.

29. The system of claim 26 in which each said central solenoidal coil is substantially round in cross section.

30. The system of claim 26 in which each said central solenoidal coil is substantially trapezoidal in cross section.

31. A non-ferromagnetic elongate coil for producing an external localized flux region, said coil comprising:

a central substantially solenoidal coil wound on a coilform of length $h_S$ and major diameter $d_S$ and having a mean first axis of symmetry;

two transverse coils, one disposed at each end of said central solenoidal coil, having axes perpendicular to said first axis, and having outside diameter $d_T$ and axial length $h_T$ such that $h_T$ is less than $d_S$;

a portion of the turns of each of the transverse coils interleaved with a portion of the turns of the central substantially solenoidal coil.

32. The coil of claim 31 in which each said transverse coil comprises a cross coil, each said cross coil wound on a respective solenoidal coilform.

33. The coil of claim 31 in which each said transverse coil comprises a saddle coil portion, said saddle coil portion comprising conductors threaded through transverse holes in the solenoidal coilform.

34. The coil of claim 31 in which said central solenoidal coil is substantially round in cross section.

35. The coil of claim 31 in which said central solenoidal coil is substantially trapezoidal in cross section.

36. The coil of claim 31 in which said coilform is made from a material selected from the set consisting of alumina, silicon nitride, zirconia, alumina-silica-boria glasses, borosilicate glasses, machinable glasses, plastic composites having at least 10% carbon fiber content, plastic composites having more than 25% ceramic fiber content, and plastic composites having density greater than 2.0 g/cm$^3$.

37. The coil of claim 31 in which the central substantially solenoidal coil is partitioned into top, middle, and bottom portions, a first of the transverse coils is interleaved with the top portion, and the other of the transverse coils is interleaved with the bottom portion.

38. The coil of claim 31 in which the central substantially solenoidal coil is partitioned into first, second, third, fourth, and fifth portions, and each of the transverse coils is partitioned into outer and inner portions, the outer portions surrounding the respective inner portions; the outer portion of a first of the transverse coils interleaved with the first and second portions, the outer portion of the other of the transverse coils interleaved with the fourth and fifth portions, the inner portion of the first of the transverse coils interleaved with the first portion, and the inner portion of the other of the transverse coils interleaved with the fifth portion.

39. An inclined-turn axial coil assembly having an axis defining and connecting a top and a bottom of a central coil of the assembly, a first plane containing the axis defining and separating a front and a back of the assembly, the turns of the central coil disposed so as to have substantially reflectional symmetry with respect to a second plane perpendicular to the axis and bisecting the assembly, each of the turns being substantially reflectionally symmetrical with respect to a third plane perpendicular to the first and second planes, the turns each defining a plane having an angle of inclination defined by the intersection with the second plane, the intersections of the central coil turns all being to the front of the assembly, and the angle of inclination increasing for turns further and further from the second plane, said turns extending to a first distance from the second plane, further comprising a pair of end coils at respective ends of the central coil and more distant from the second plane than said first distance, the turns thereof each defining a plane with an angle of inclination defined by the intersection with the second plane, the intersections of the end coil turns all being to the back of the assembly.

40. A non-ferromagnetic transverse gradient coil system having a central axis, said system comprising:

an even number of solenoidal-like central axial assemblies having a major diameter wound on rigid coilforms having axial coil axes parallel to said central axis and positioned such that the distance between said central axis and each said axial coil axis is greater than the major diameter of said axial coils, the assemblies arranged substantially symmetrical with respect to 180° rotation about the central axis, the assemblies being substantially symmetrical with respect to reflection through a first plane perpendicular to said central axis;

each of said assemblies further characterized in that for each of said assemblies, its axial coil axis defines and connects a top and a bottom of a central coil of the assembly, a second plane contains the axis defining and separating a front toward the central axis and a back of the assembly outward from the central axis, each of the turns of the central coil of the assembly being substantially reflectionally symmetric with respect to a third plane perpendicular to the first and second planes, the turns each defining a plane having an angle of inclination defined by the intersection with the second plane, the intersections of the central coil turns all being toward the central axis, and the angle of inclination increasing for turns further and further from the second plane, said turns extending to a first distance from the second plane.

41. The system of claim 40 in which each of the said assemblies further comprises a pair of end coils at respective ends of the central coil and more distant from the second plane than said first distance, the turns thereof each defining a plane with an angle of inclination defined by the intersection with the second plane, the intersections of the end coil turns all being outward from the central axis.

42. The system of claim 40 in which each said central coil is substantially round in cross section.

43. The system of claim 40, in which each said central coil is substantially trapezoidal in cross section.

* * * * *